United States Patent

Kusumoto et al.

[11] Patent Number: 5,936,437
[45] Date of Patent: Aug. 10, 1999

[54] ANALOG-TO-DIGITAL CONVERTER WITH CAPACITOR NETWORK

[75] Inventors: Keiichi Kusumoto, Osaka; Akira Matsuzawa, Kyoto, both of Japan

[73] Assignee: Matsushita Electric Industrial Co., Ltd., Osaka, Japan

[21] Appl. No.: 08/605,585

[22] Filed: Feb. 22, 1996

Related U.S. Application Data

[60] Continuation of application No. 08/250,677, May 26, 1994, abandoned, which is a division of application No. 08/035,614, Mar. 23, 1993, Pat. No. 5,402,128.

[30] Foreign Application Priority Data

Mar. 23, 1992 [JP] Japan ................................. 4-064553

[51] Int. Cl.⁶ ................................................. G11C 27/02
[52] U.S. Cl. ............................. 327/94; 327/91; 327/93; 341/172; 341/159
[58] Field of Search ..................... 327/362, 403, 327/415, 91, 93, 94, 97; 341/172, 159; 307/48

[56] References Cited

U.S. PATENT DOCUMENTS

| | | | |
|---|---|---|---|
| 3,588,748 | 6/1971 | Inaba | 327/403 |
| 4,350,975 | 9/1982 | Haque et al. | 340/347 CC |
| 4,381,496 | 4/1983 | Carter | 340/347 AD |
| 4,418,744 | 12/1983 | Sidebottom | 327/403 |
| 4,458,237 | 7/1984 | Domogalla | 340/347 |
| 4,746,871 | 5/1988 | de la Plaza | 328/127 |
| 4,797,899 | 1/1989 | Fuller et al. | 375/7 |
| 4,897,774 | 1/1990 | Bingham et al. | 363/61 |
| 4,999,633 | 3/1991 | Draxelmayr | 341/120 |
| 5,014,055 | 5/1991 | Dingwall et al. | 341/159 |
| 5,113,090 | 5/1992 | Imaizumi et al. | 327/91 |
| 5,225,837 | 7/1993 | Hosotani et al. | 341/159 |
| 5,235,333 | 8/1993 | Naylor et al. | 341/172 |
| 5,258,761 | 11/1993 | Fotouhi et al. | 341/172 |
| 5,469,164 | 11/1995 | Kemp | 341/145 |
| 5,548,259 | 8/1996 | Ide et al. | 335/78 |
| 5,638,072 | 6/1997 | Van Auken et al. | 341/141 |

FOREIGN PATENT DOCUMENTS

| | | |
|---|---|---|
| 57-26131 | 7/1955 | Japan . |
| 61-212120 | 9/1986 | Japan . |
| 62-91023 | 4/1987 | Japan . |
| 63-144617 | 6/1988 | Japan . |
| 63-157398 | 6/1988 | Japan . |
| 63-177609 | 7/1988 | Japan . |
| 1-183258 | 7/1989 | Japan . |
| 3-099276 | 4/1991 | Japan . |

Primary Examiner—Timothy P. Callahan
Assistant Examiner—Jung Ho Kim
Attorney, Agent, or Firm—McDermott, Will & Emery

[57] ABSTRACT

Link capacitors are used to establish connection between joining-points of coupling capacitors and inverters in an inverter chopper comparator array, in order to reduce injected electric charge variation due to feedthrough. Some of the comparators in the comparator array, arranged at each end thereof, constitute a redundant comparator array without connection to a logic circuit that is used to obtain an A/D conversion output. This reduces the effects of the device parameter variations in the comparator array whereby a high accuracy voltage comparison is achieved, and noise-resistant strength is improved.

9 Claims, 28 Drawing Sheets

F I G. 13
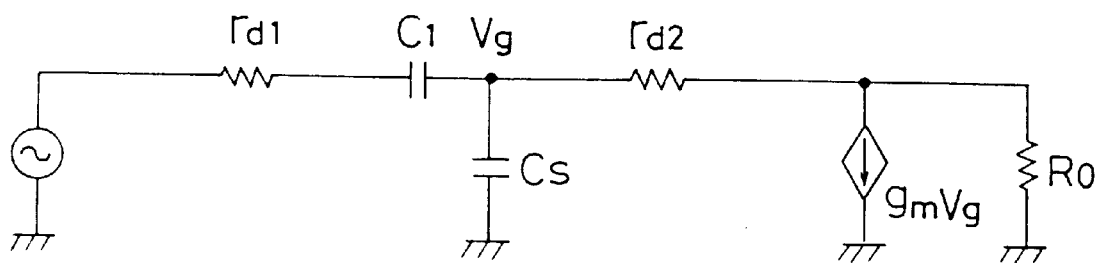

5,936,437

ANALOG-TO-DIGITAL CONVERTER WITH CAPACITOR NETWORK

This is a continuation application of application Ser. No. 08/250,677, filed May 26, 1994, abandoned, which is a divisional application of Ser. No. 08/035,614, filed Mar. 23, 1993 U.S. Pat. No. 5,402,128.

BACKGROUND OF THE INVENTION

This invention relates to a comparator array with a capacitor network, and it further pertains to an ADC (analog-to-digital converter) with the comparator array.

High-speed voltage comparators have been applied particularly to an ADC for image processing. Inverter chopper comparators, composed of CMOS transistors, are known in the art. This inverter chopper comparator finds many applications in monolithic ADC's that are realized by VLSI process technology for CMOS transistors.

FIG. 20 illustrates the typical configuration of an inverter chopper comparator made up of CMOS transistors. The configuration of first to fourth switches SW1, SW2, SW3, and SW4 is selected from among those, as shown in FIG. 21, namely, a PROS transfer gate (FIG. 21(b)), an NMOS transfer gate (FIG. 21(c)), and a CMOS transfer gate (FIG. 21(d)). An analog input signal source 1 is connected to one terminal of SW1, and the other terminal of SW1 is connected to one terminal of a first coupling capacitor C1. One terminal of SW2 is connected to a series of reference resistors 4 that divides a potential difference between two reference voltage sources 2 and 3, while the other terminal of SW2 is connected to the same terminal of the first coupling capacitor C1 that SW1 is connected to. The remaining terminal of the first coupling capacitor 1 (i.e., the terminal as not being connected to SW1 or SW2) is connected to the input terminal of a first inverter 6. Second and third inverters are indicated by reference numerals 12 and 13, respectively.

The configuration of the inverters 6, 12, and 13 is selected from among those, shown in FIG. 22, namely a CMOS inverter (FIG. 22(b)), an E/E inverter (FIG. 22(c)), and an E/D inverter (FIG. 22(d)). One terminal of SW3 is connected to the input terminal of the first inverter 6, while the other terminal of SW3 makes connection with the output terminal of the inverter 6. One terminal of a second coupling capacitor C3 is connected to the input terminal of the second inverter 12, and the other terminal of coupling capacitor C3 is connected to the output terminal of the first inverter 6. One terminal of SW4 is connected to the input terminal of the second inverter 12, and the other terminal thereof is connected to the output terminal of the second inverter 12. The output terminal of the second inverter 12 is connected to the input terminal of the third inverter 13.

The operation concerning the above is now described. FIG. 23 is the on/off timing diagram of SW1 to SW4, in which HIGH-level indicates an on-state while LOW-level indicates an off-state.

During the sampling period, SW1, SW3, and SW4 are turned on. Then the analog input signal source 1 is connected to the first coupling capacitor C1. The analog input voltage of Vin from the source 1 is developed at the one terminal of C1. Developed at the other terminal of C1 is the voltage of Va corresponding to operating point A of FIG. 24. Since SW3 is on, both voltages, appeared at the input and output terminals of the first inverter 6, are Va at point A at which the static characteristic curve of the input voltage versus the output voltage intersects the line where the input and output voltages are equal to each other. Since SW4 is likewise on, both voltages, appeared at the input and output terminals of the second inverter 12, are Va.

During the holding period, SW1, SW3, and SW4 are now turned off. This allows for the first coupling capacitor C1 to hold a potential difference, between Vin and Va. From the relation between the electric charge stored and the difference of terminal voltages in a parallel plate capacitor (i.e., the relation of Q=CV), the electric charge Q1, held in the coupling capacitor C1, is:

$$Q1 = C1(Vin-Va) \tag{1}$$

During the comparison period, SW2 is turned on. Then, a potential difference between the voltage Vb at the input terminal of the first inverter 6 and the reference voltage of Vref is applied across the coupling capacitor C1. SW3 is in off-state, and the input terminal of the first inverter 6 is of a MOS transistor gate. Thus, input impedance of the first inverter 6 is considerably high enough to assume that the inflow and outflow of a current can practically be disregarded. Therefore, the electric charge, stored at the input terminal of the first inverter 6, has been maintained since the holding period. This makes the following formula hold.

$$Q1 = C1(Vref-Vb) \tag{2}$$

To find Vb, the formula (2) is substituted by the formula (1) to eliminate Q1.

$$Vb = Vref - Vin + Va \tag{3}$$

The formula (3) proves that Vb (i.e., the voltage at the input terminal of the first inverter 6) changes from Va by (Vref−Vin) (see FIG. 25). Here, if the voltage gain of the first inverter 6 is −Gf (Gf>1), the amount of change in the output voltage of the first inverter 6 (i.e., ΔVof) is:

$$\Delta Vof = -Gf(Vref-Vin) \tag{4}$$

Also, in the second inverter 12, the input voltage is amplified through the same operation. If the voltage gain of the second inverter 12 is −Gs (Gs>1), ΔVos (i.e., the amount of change of the output voltage of the second inverter 12 from Va) is obtained by multiplying ΔVof by (−Gs). ΔVos can be expressed by:

$$\Delta Vos = GfGs(Vref-Vin) \tag{5}$$

Since the formula (5) shows that ΔVos is proportional to (Vref−Vin), and the coefficient of proportion is GfGs, this proves that the difference between Vref and sampled Vin is output after being multiplied by GfGs. The output voltage of the second inverter 12 is further inverted and amplified to a logical voltage which indicates a comparison result.

An ADC that employs the above-described inverter chopper comparator is described. FIG. 26 shows the layout of a conventional parallel-type 3-bit ADC. A series of reference resistors 4 is connected between first and second reference voltage sources 2 and 3. A comparator array 15 contains seven comparators 14. One input terminal of each comparator 14 is connected to the series of reference resistors 4, the other input terminal thereof is connected to an analog input signal source 1, and its output terminal is connected to a logic circuit 5. The output of the logic circuit 5 is an ADC output 9. Potential differences between the input terminals of the comparators 14, connected to the reference resistors 4, are set equal. In other words, for the reference voltages VRi (i=1, 2, 3, . . . 7) which are obtained from the reference resistors 4, VRi+1−VRi (i=1, 2, 3, . . . , 6) are set equal to each other.

The operation of the ADC, shown in FIG. 26, is described by referring to FIGS. 27 and 28. An analog input signal which varies with the lapse of time is sampled by the respective comparators 14 at equal time intervals. In FIG. 27, the abscissa indicates the time, and the ordinate indicates the analog input voltage. ANj (j=−1, 0, 1, 2, . . . , 7) represents the respective sampled analog input voltages at Tsj, where Tsj+1−Tsj (j=−1, 0, 1, 2, . . . , 6) are equal to each other.

The sampled analog input voltage ANj is compared with the reference voltages VRi by the respective comparators 14. For example, if ANj satisfies the condition of VR5>ANj>VR4, the comparators, to which VR7, VR6, and VR5 are applied, each give a level "1" output (i.e., a higher logical level output), from the judgment that ANj is lower than the respective reference voltages VRi. On the other hand, the remaining comparators, to which VR4, VR3, VR2, and VR1 are applied, each give a level "0" output(i.e., a lower logical level output), from the judgment that ANj is greater than the respective reference voltages VRi. Thus a bit string [1110000] is fed from the comparator array 15. Such a bit string undergoes a code-conversion in the logic circuit 5 and [100] is obtained as the ADC output 9 (see FIG. 28). The output of the ADC varies, depending on the reference voltages VRi each of which serves as a threshold. FIG. 28 shows the relation of the analog input voltage versus the output of the ADC.

The organization of a typical differential chopper comparator is now described. FIG. 29 shows the layout of a conventional differential chopper comparator. Here, the first, second, and third switches are indicated by SW5, SW6, and SW8, respectively. Of them, the third switch, SW 8 is of a 3-terminal type so that it has two input terminals "a" and "b" for receiving two voltage signals to be selected, and a single output terminal "c" for outputting a single selected signal. The comparator is further provided with SW7.

An analog input signal source I is connected to the input terminal "a" of SW8 as well as to one terminal of SW5. The other terminal of SW5 is connected to one terminal of one of a pair of input capacitors C5 as well as to the input terminal of a first source follower 19. The input terminal "b" of SW8 is connected to a series of reference resistors 4 that divides a potential difference between voltage sources 2 and 3. One terminal of SW6 is connected to the output terminal "c" of SW8, while on the other hand the other terminal of SW6 is connected to one terminal of the other input capacitor C5 as well as to the input terminal of a second source follower 21. The other terminals of C5 are connected to respective constant-potential points. The output terminal of the first source follower 19 is connected to the non-inverting input terminal of a first differential amplifier 20. The output terminal of the second source follower 21 is connected to the inverting input terminal of the first differential amplifier 20. The inverting output terminal of the first differential amplifier 20 is connected, through one of a pair of coupling capacitors C6, to the non-inverting input terminal of a second differential amplifier 22, while on the other hand the non-inverting output terminal of the first differential amplifier 20 is connected, through the other coupling capacitor C6, to the inverting input terminal of the second differential amplifier 22. The inverting output terminal of the second differential amplifier 22 is connected, through one of the switches SW7, to the non-inverting input terminal of the second differential amplifier 22, while on the other hand the non-inverting output terminal of the second differential amplifier 22 is connected, through the other SW7, to the inverting input terminal of the second differential amplifier 22. FIG. 30, comprised of 30(a) and 30(b), shows the organization of the first differential amplifier 20 along with that of the second differential amplifier 22.

FIG. 31 Is the on/off timing diagram of SW5, SW6, SW8 and SW7.

During the sampling period, SW5, SW6, and each SW7 are all in on-state and SW8 is on selection of an analog input voltage Vin from the analog input signal source 1 in which condition each C5 stores the analog input voltage of Vin. Each C6 stores a DC offset voltage between the first and second differential amplifiers 20 and 22. During the holding period, SW5 and SW6 are turned off. During the first comparison period, SW5 and each SW7 are turned off, SW6 is turned on, and SW8 selects a reference voltage Vref from the reference resistors 4, resulting in one of C5's, connected to the input terminal of the second source follower 21, storing the reference voltage Vref. Then during the second comparison period, SW5, SW6, and both SW7 make a transition to off-state, so that a differential voltage between Vin sampled and Vref is amplified by the first and second differential amplifiers 20 and 22, which is output as a voltage comparison result.

As mentioned above, the configuration of four switches SW1, SW2, SW3, and SW4 of the inverter chopper comparator of FIG. 20 is selected from among those, namely, an NMOS transfer gate, a PMOS transfer gate, and a CMOS transfer gate. These transfer gates are composed of MOS transistors, the conduction between drain and source electrodes of which is controlled with a clock signal (hereinafter referred to as the "switch control signal") delivered to respective gate electrodes. The injection of electric charge into a drain (or a source) region of the MOS transistor through a gate-to-drain (or a gate-to-source) capacitance (hereinafter called "feedthrough") occurs, when the switch control signal makes a transition from HIGH to LOW, or vice versa. This is one of inevitable behaviors of transfer gates. The inverter chopper comparator, as described above, holds the analog input voltage Vin at the time when a transition from the sampling period to the holding period is made. Particularly, in FIG. 20, if electric charge is injected into (or extracted from) the joining point of the first coupling capacitor C1 and the first inverter 6 and injected into (or extracted from) the joining point of the second coupling capacitor C3 and the second inverter 12 when SW1, SW3, and SW4 each make a transition to off-state, this causes errors in the voltage held in the comparator. It is known that the amount of injected (or extracted) electric charge, due to the feed-through, depends upon values of drain or source, gate length, gate width, and threshold voltage (hereinafter these values are called the "device parameters").

FIG. 26 shows one of high-speed ADC architectures which is provided with plural comparators. If the voltage held in each comparator is made varied because of the variation in electric charge injected into the comparators, this presents some problems that the differential nonlinearity error (hereinafter referred to as "DNL") of ADC becomes serious and its frequency characteristics are subject to degradation. Particularly, in a case where the ADC is applied for image processing, DNL is regarded as the important index of image degradation at the time when digital signals obtained are reproduced in the form of image. DNL depends upon the quality of adjustment between comparators. The variation in the device parameters of a MOS transistor has been a major factor determining the yield of the ADC, its costs, and the limit of conversion accuracy.

The mutual conductance variation, due to the variation in the device parameters of the inverters 6 and 12 of each comparator, makes the time constant of charging/discharging of coupling capacitors C1 and C3 vary. This produces a problem that DNL at a high-frequency analog input signal greatly increases. Noise superposed on power supply lines and noise from the logic circuit will get into the comparators. This makes DNL greatly increase. This also results in the degradation in signal-to-noise ratio (S/N).

In accordance with the differential chopper comparator, shown in FIG. 29, electric charge, due to the feedthrough occurring at the time when SW5 and SW6 each make a transition from on-state to off-state, is substantially equally injected into the pair of input capacitors C5 respectively if the difference between Vin (the analog input voltage) and Vref (the reference voltage) is small. Further, such injected electric charge as a result of the feedthrough is deadened in the first differential amplifier 20. Accordingly, the offset error of the threshold voltage is more eliminated as compared to the foregoing inverter chopper comparator. However, if the device parameters of both SW5 and SW6 and the capacitances of C5 vary, the above-described ill effects will appear. This also presents a problem that DNL becomes greater.

DISCLOSURE OF THE INVENTION

It is a general object of the present invention to reduce the effects of the variation in the device parameters of a comparator array so that a high accuracy voltage comparison for an analog input signal(a high-frequency one ) can be achieved and noise-resistant strength can be improved.

To accomplish the above object, the invention provides a linking capacitor network between terminals of the same stage in a comparator array. For example, suppose that it is designed, in a circuit containing two comparators, that a potential difference between a first terminal and a second terminal is held at a constant value (including a value of zero). In this case, even when the foregoing potential difference, which should be constant, happens to vary because the characteristics of circuit elements vary, in order to make that varying potential difference approach as close to the constant value as possible by scattering the effects of the circuit element characteristic variation, a capacitor is intervened between the first and second terminals for interconnection. Therefore, regardless of whether a current flows through each terminal or even in the event that one state at which a current flows through each terminal is changed to the other where no current flows through any of the terminals, the effects of the variation in the circuit element characteristics are relieved because of the action of the capacitor intervened between the terminals.

If input terminals of an inverting amplifier section (or a differential amplifier section) in an ADC containing an array of inverter chopper comparators (or in an ADC containing an array of differential chopper comparators) are connected together using capacitors, this reduces in each comparator the threshold voltage variation due to the feedthrough variation, even though the device parameters of circuit elements in each comparator vary. As a result, the variation in sampling time constant can be reduced, the differential nonlinearity and the frequency characteristics of the ADC can be improved, and the effects of the variation in semiconductor fabrication process can be relieved, which can be realized even at a lower power-supply voltage. Further, a noise-resistant strength against noise superposed on power supply lines and against noise from an ADC logic circuit can be improved.

Additionally, if the comparators at both ends of the comparator array are redundant comparators that are not used for A/D conversion, this assures that the effects of the feedthrough occurring in the comparators used for A/D conversion which are adjacent to the redundant comparators.

BRIEF DESCRIPTION OF THE DRAWINGS

The invention will become more apparent when considered in conjunction with the appended drawings, in which:

FIG. 13 is an a.c. equivalent circuit diagram of the inverter chopper comparator of FIG. 12;

PREFERRED EMBODIMENTS OF THE INVENTION

Preferred embodiments according to the present invention are described below.

FIRST EMBODIMENT

Figure 1:
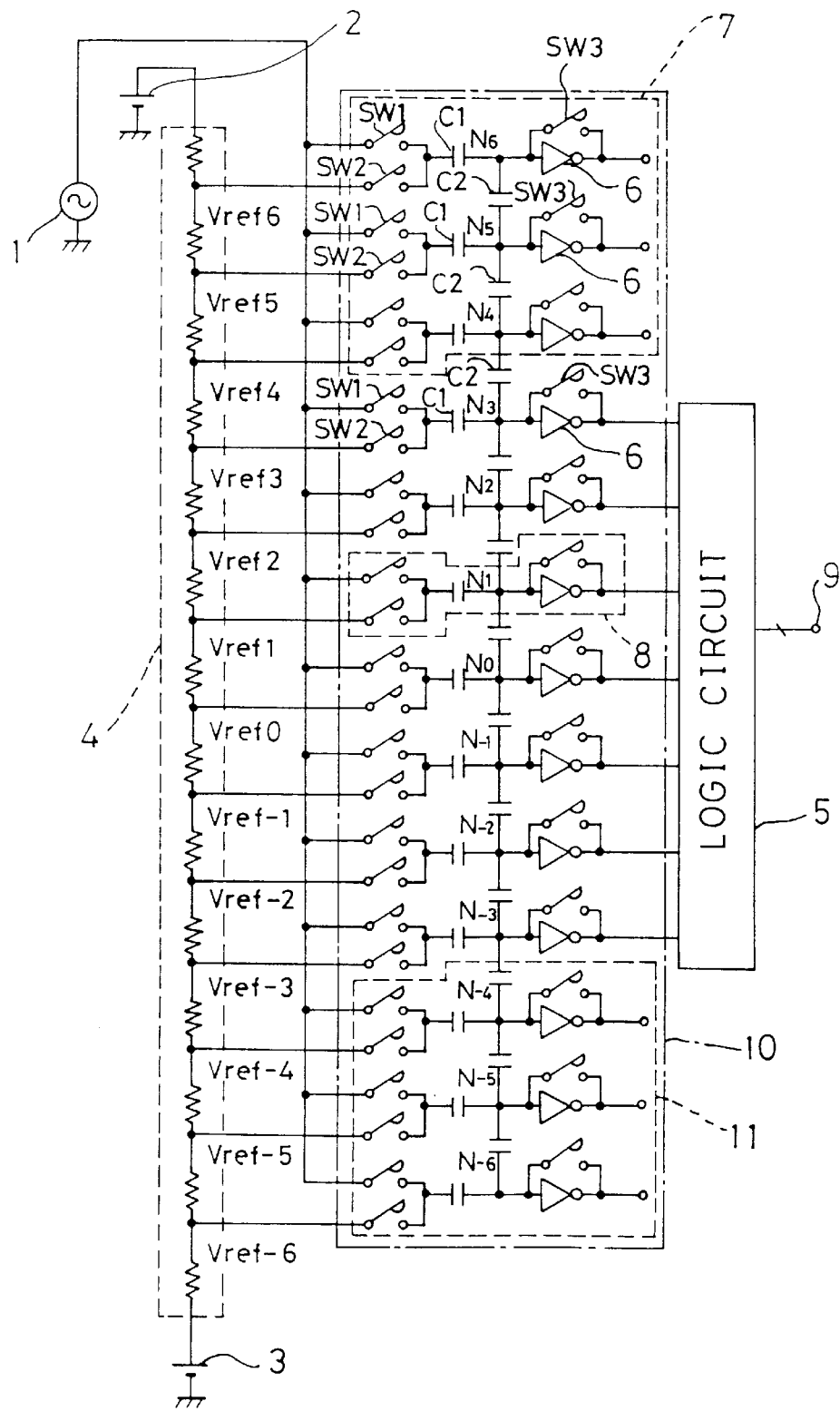
FIG. 1 shows the organization of an ADC of a first embodiment of the present invention.

FIG. 1 shows the layout of a 3-bit ADC in accordance with the first embodiment. A first reference voltage source is connected to one end of a series of reference resistors 4 while on the other hand a second reference voltage source 3 is connected to the other end of the reference resistors 4. Reference voltages, represented by Vrefi (i=−6, . . . , −2, −1, 0, 1, 2, . . . , 6), are drawn out of 13 terminals of the reference resistors 4. The same potential difference is given between every adjoining terminals of such 13 terminals. A comparator array 10 is composed of 13 inverter chopper comparators 8, only seven of which at the center are connected through their respective output terminals to a logic circuit 5. The output of the logic circuit 5 is an ADC output 9. Three of the comparators 8 at one end of the of comparator array 10 together constitute a first redundant comparator array 7 while three of the comparators 8 at the other end together constitute a second redundant comparator array 11.

Figure 23:
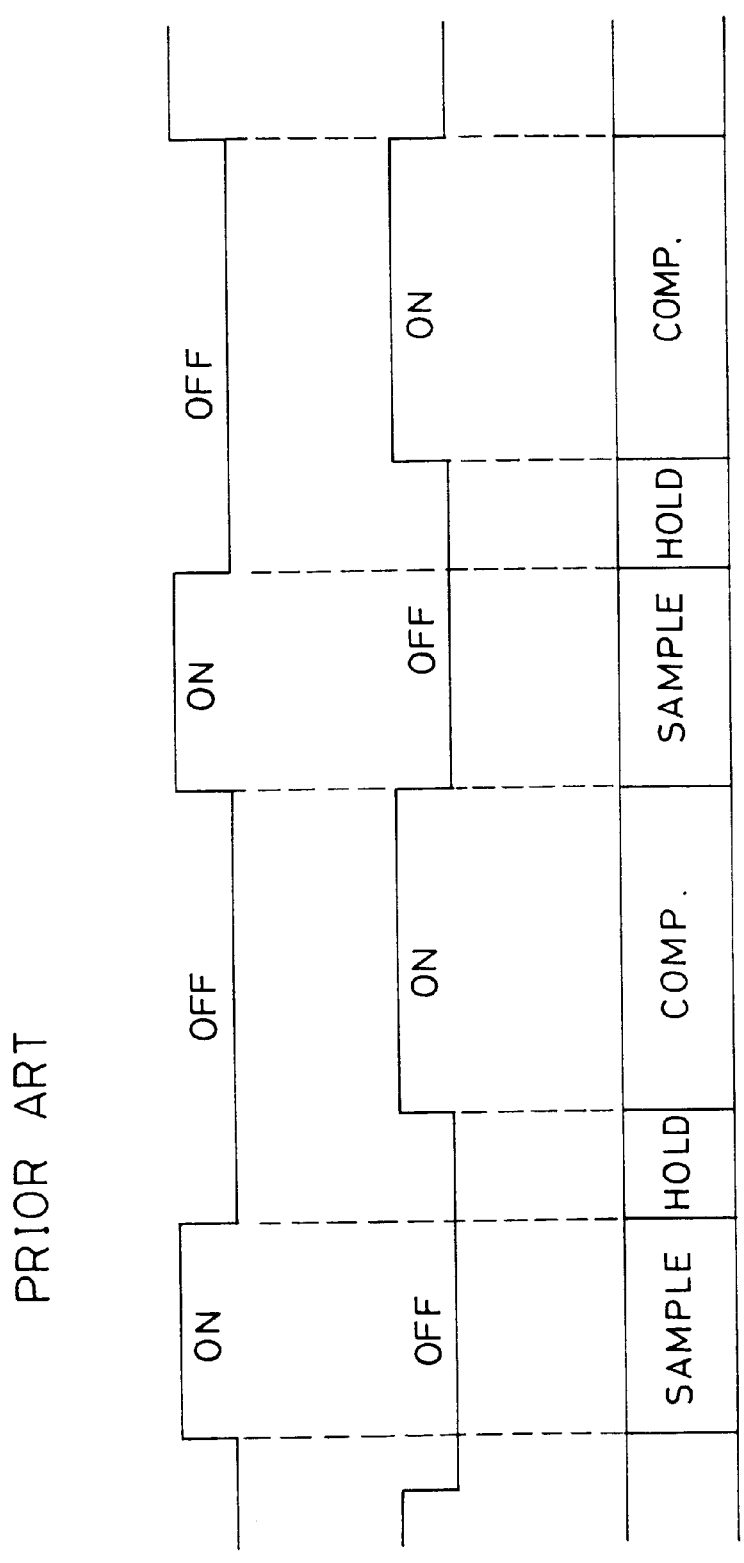
FIG. 23 is the on/off timing diagram of each switch of FIG. 20.
Figure 24:
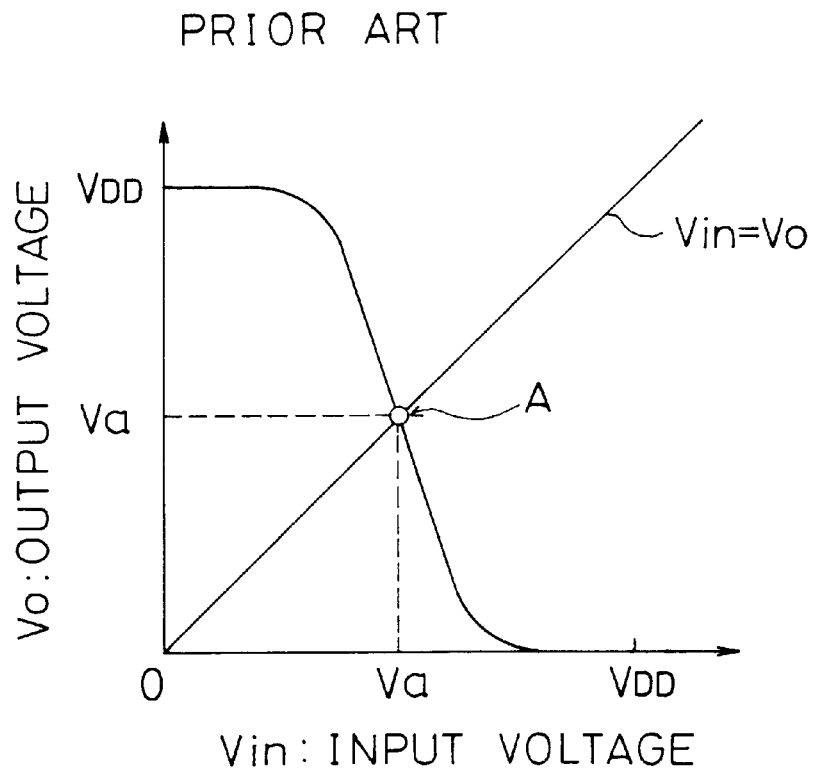
FIG. 24 is the static characteristic diagram showing the relation of the input voltage versus the output voltage of the inverter of FIG. 20.
Figure 25:
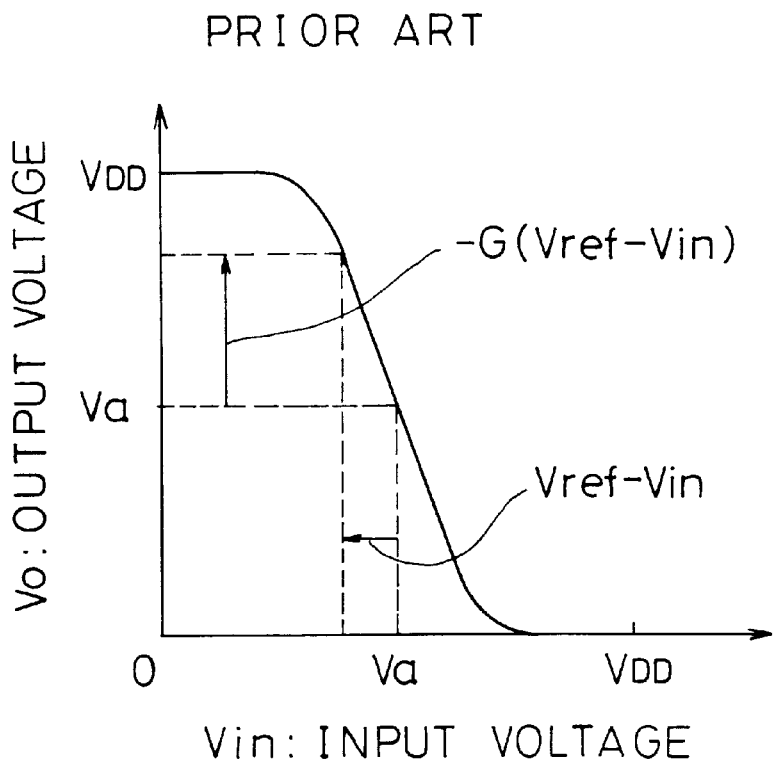
FIG. 25, which is similar to FIG. 24, shows the voltage gain of the inverter of FIG. 20.
Figure 26:
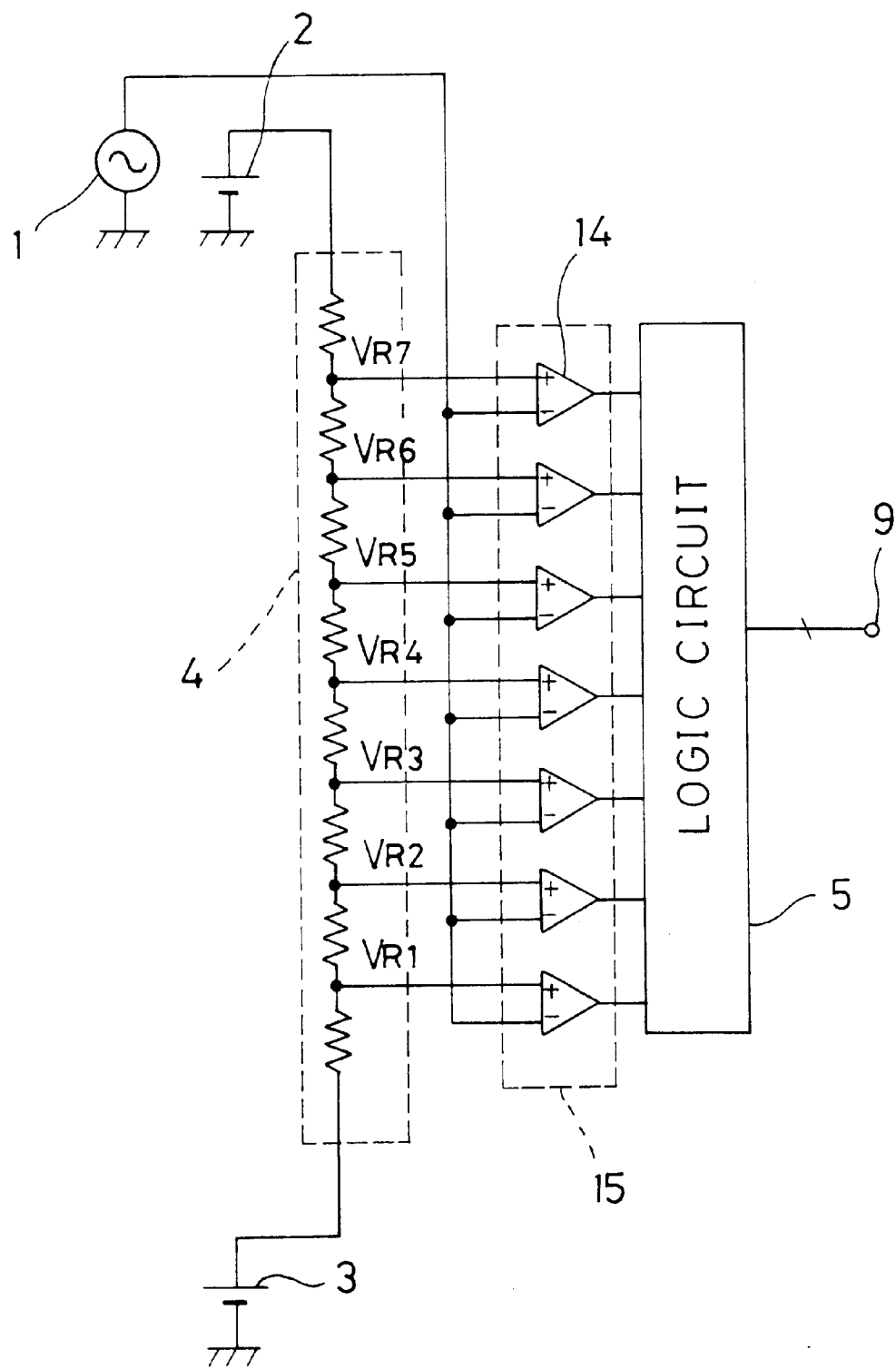
FIG. 26 shows the organization of a conventional parallel type ADC.
Figure 27:
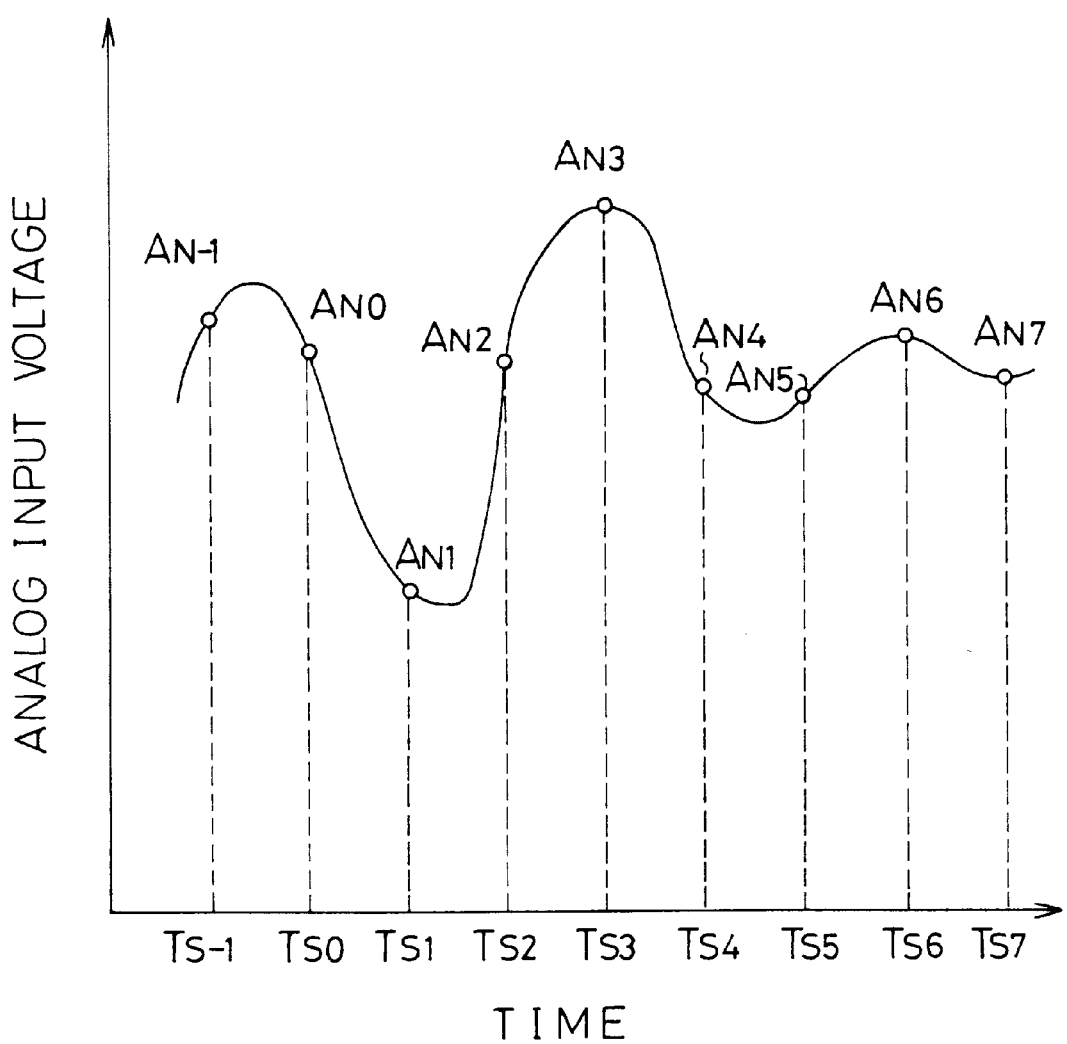
FIG. 27 shows the relation of each sampling time versus the sampled analog input voltage so as to describe the operation of the ADC of FIG. 26.
Figure 28:
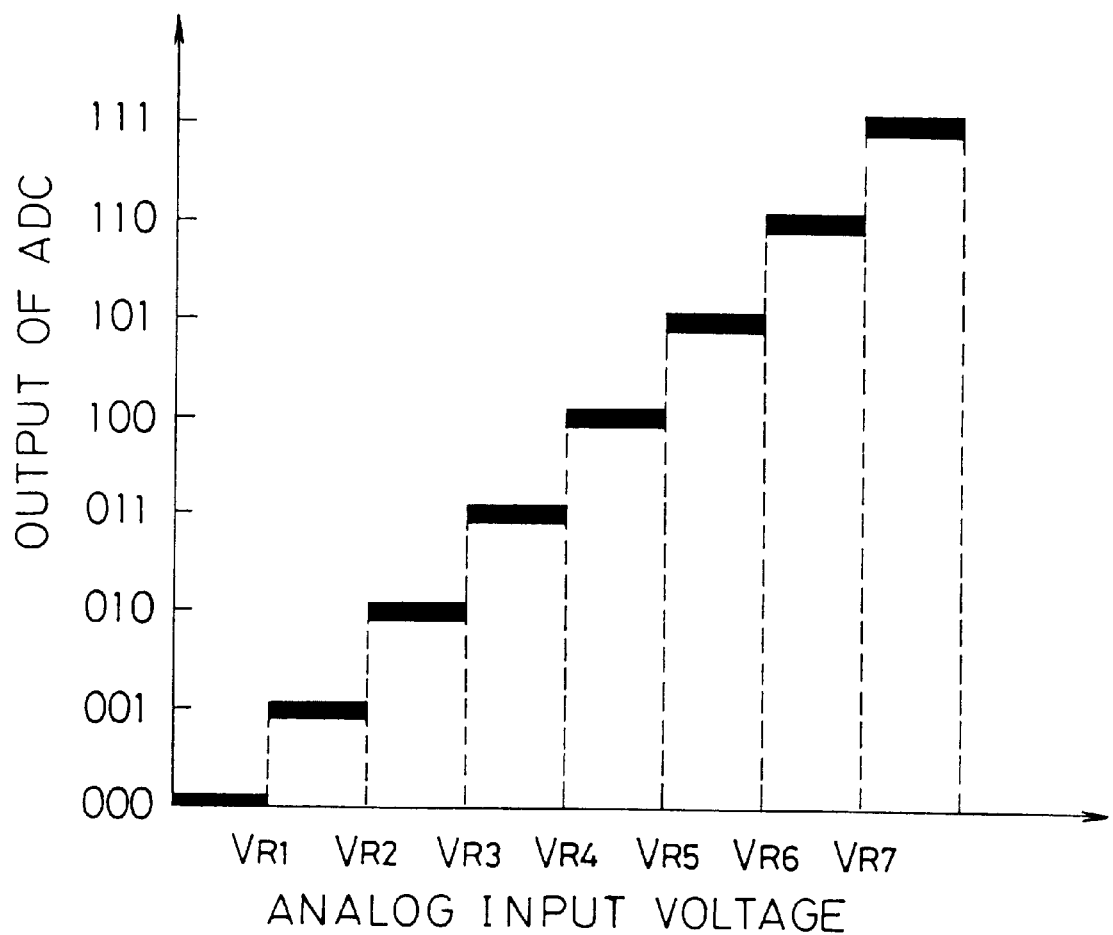
FIG. 28 shows the relation of the analog input voltage versus the ADC output so as to describe the operation of the ADC of FIG. 26.

The comparators 8 each have the following configuration. An analog input signal source 1 is connected to one terminal of a first switch SW1 and the other terminal of SW1 is connected to one terminal of a coupling capacitor C1. One terminal of a second switch SW2 is connected to a selected terminal of reference resistor 4 and the other terminal of SW2 is connected to the same terminal of C1 that SW1 is connected to. The other terminal of C1, connected to none of SW1 and SW2, is connected to the input terminal of an inverter 6. One terminal of a third switch SW3 is connected to the input terminal of the inverter 6 while the other terminal of SW3 is connected to the output terminal of the inverter 6. Further, in this embodiment, each link capacitor C2 intervenes between joining-points, represented by Ni (i=−6, . . . , −2, −1, 0, 1, 2, . . . , 6), at which one terminal of the coupling capacitor C1, the input terminal of the inverter 6, and one terminal of the third switch SW3 of each comparator 8 are connected together. Each of the 12 link capacitors C2 is connected between every two adjacent joining-points (hereinafter called the "nodes" Ni) to form a capacitor network. The on/off timing of SW1, SW2, and SW3 is the same as the conventional one of FIG. 23, except the fact that SW4 is nonexistent in this embodiment.

SECOND EMBODIMENT

Figure 2:
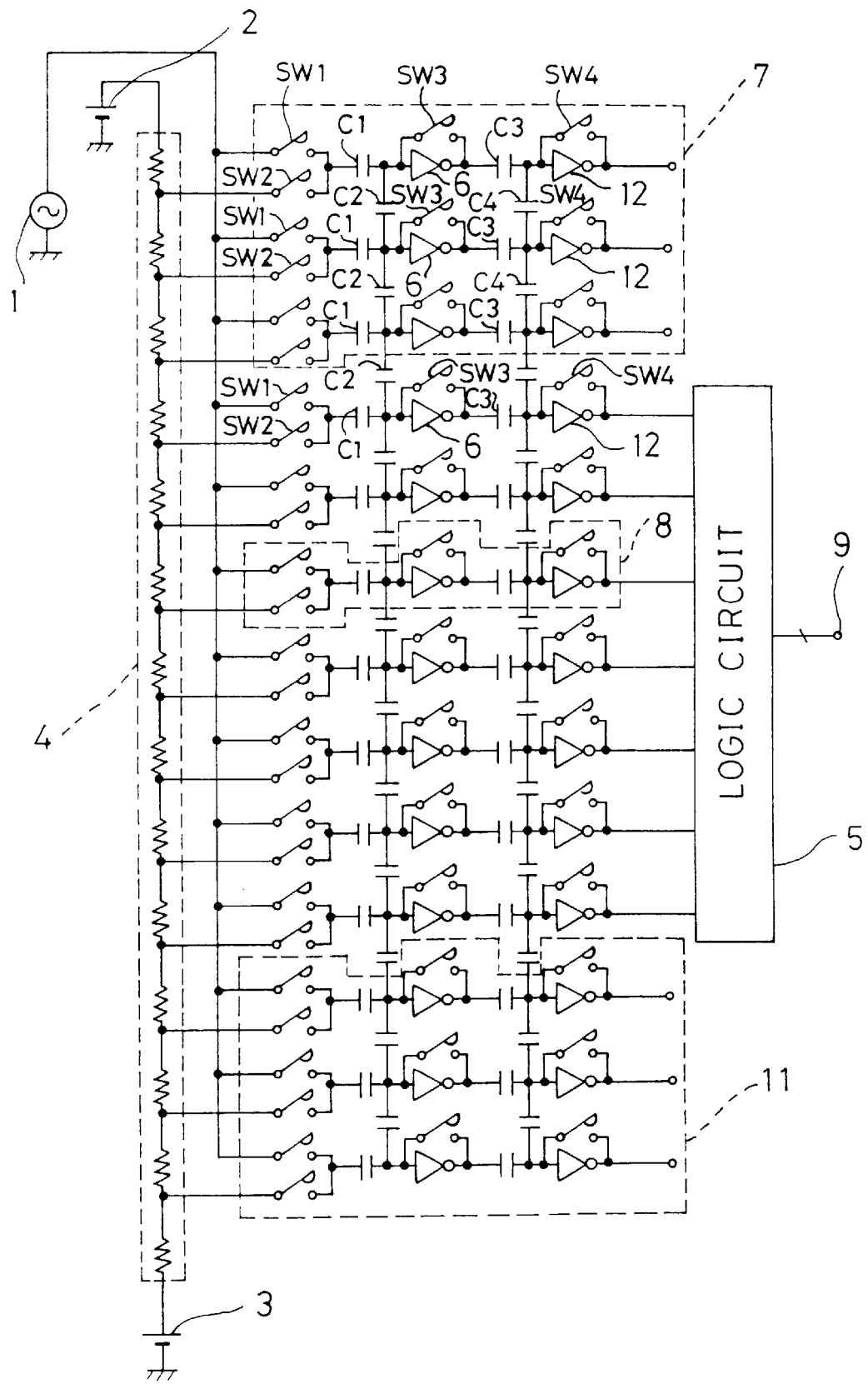
FIG. 2 shows the organization of an ADC of a second embodiment of the invention.

Referring to FIG. 2, the layout of a 3-bit ADC of the second embodiment is shown. Each one of the comparators 8 of this embodiment has a two-stage inverter configuration so that it contains, in addition to the structural elements shown in FIG. 1, a second coupling capacitor C3, a second inverter 12, and a fourth switch SW4. In this embodiment, the output terminal of the first inverter 6 is connected to one terminal of the second coupling capacitor C3. The other terminal of C3 is connected to the input terminal of the second inverter 12. One terminal of SW4 is connected to the input terminal of the second inverter 12 while the other terminal of SW4 is connected to the output terminal of the second inverter 12. Additionally, this embodiment is further characterized in that each second link capacitor C4 intervenes between joining-points at which one terminal of the second coupling capacitor C3, the input terminal of the second inverter 12, and one terminal of the fourth switch SW4 of each comparator 8 are all connected together. The on/off timing of SW1, SW2, SW3, and SW4 is the same as the one of FIG. 23.

THIRD EMBODIMENT

Figure 3:
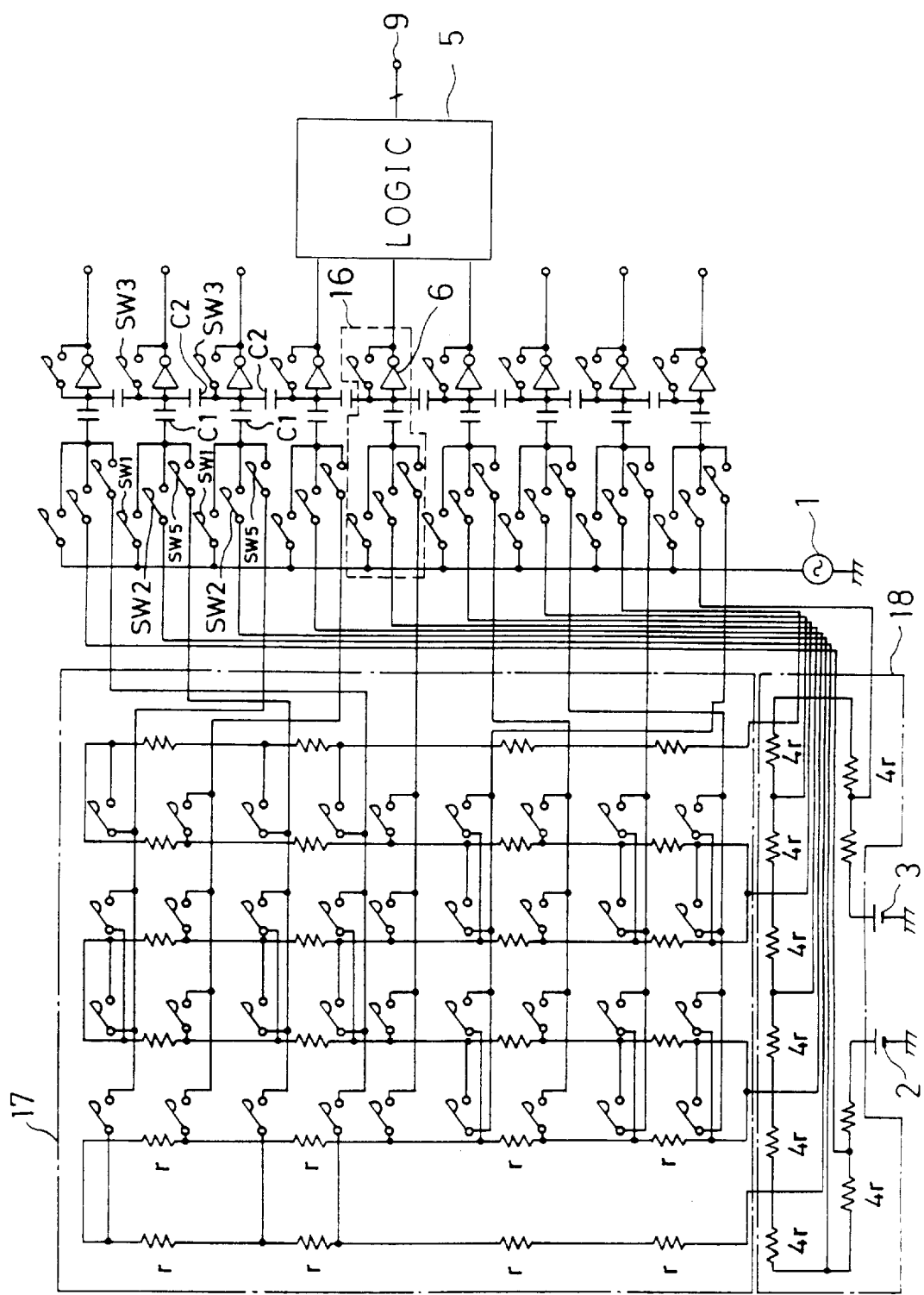
FIG. 3 shows the organization of an ADC of a third embodiment of the invention.

Referring now to FIG. 3, the layout of a 4-bit ADC of serial-parallel type in accordance with the third embodiment is shown. This 4-bit ADC incorporates nine inverter chopper comparators 16 only three of which arranged at the center are connected, by way of their respective output terminals, to the logic circuit 5. Three of the inverter chopper comparators 16 at one end constitute a first redundant comparator array while three of the inverter chopper comparators 16 at the other end constitute a second redundant comparator array.

The comparator 16 of this embodiment contains, in addition to the structural elements shown in FIG. 1, a fourth switch SW5. In each one of the comparators 16, one terminal of SW5 is made connected to a Joining-point at which one terminal of the first switch SW1, one terminal of the second switch SW2, and one terminal of coupling capacitor C1 are connected, while the other terminal of SW5 is given an application of one of lower reference voltages generated by a circuit of lower reference resistors and switches 17. One of upper reference voltages, generated by a series of upper reference resistors 18, is applied to the other terminal of SW2. Further, as in the case of FIG. 1, each link capacitor C2 intervenes between joining-points at which one terminal of the coupling capacitor C1, the input terminal of the inverter 6, and one terminal of the third switch SW3 of each comparator 8 are connected together.

Figure 7:
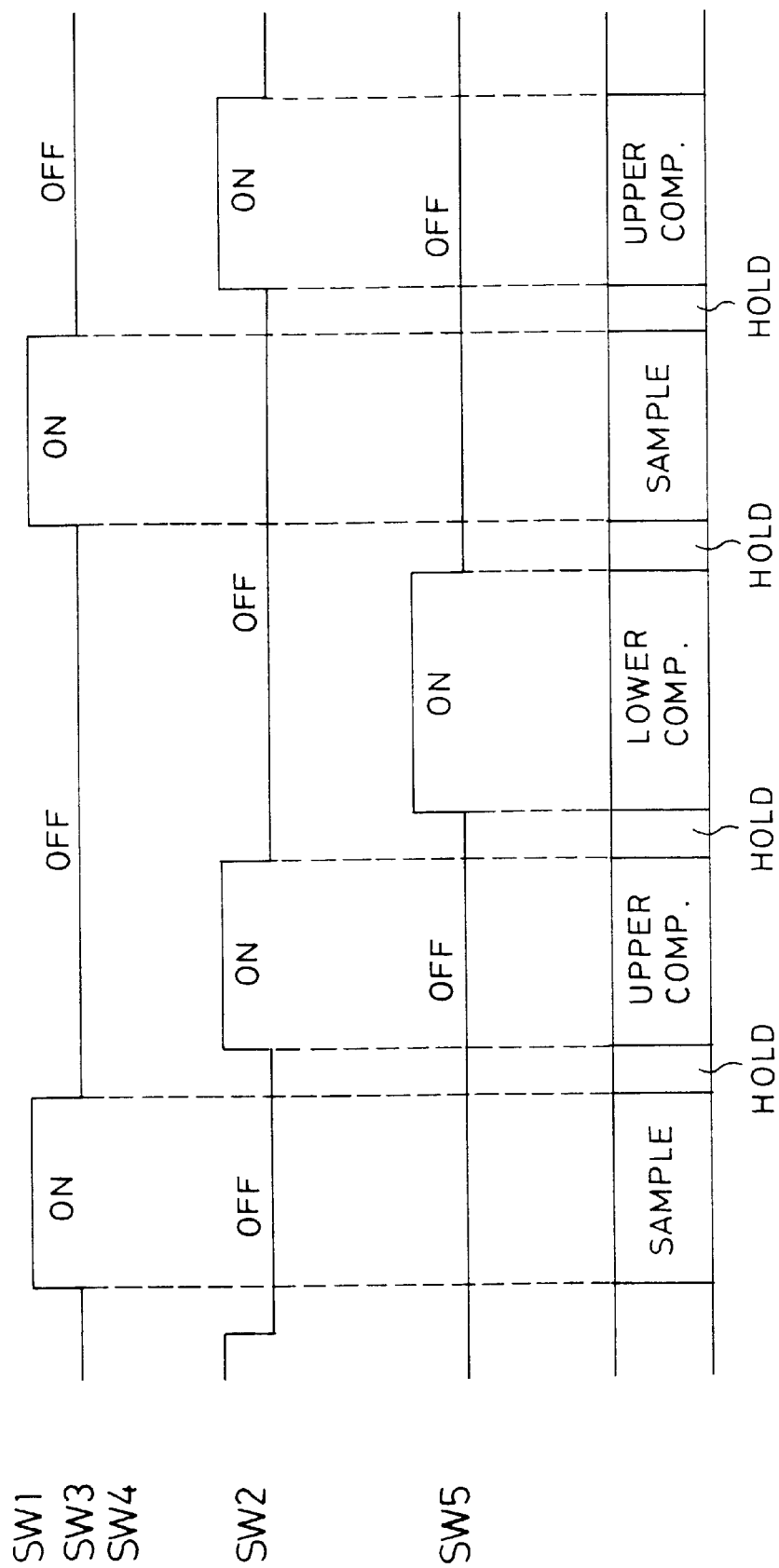
FIG. 7 is the on/off timing diagram of switches of the ADC's of FIGS. 3 and 4.

The on/off timing of four switches, that is, SW1, SW2, SW3, and SW5 is shown in FIG. 7 (SW4 is nonexistent). During the sampling period, both SW1 and SW3 are in on-state. The coupling capacitor C1 stores electric charge corresponding to Vin (i.e., the analog input from the source 1). Then the holding period starts, with coupling capacitor C1 holding therein electric charge when SW1 and SW3 are turned off. Thereafter, SW2 is turned on. One of the upper reference voltages is applied to one terminal of C1. An A/D conversion begins on the two leftmost bits (the upper comparison period). After SW2 is switched to off-state, SW5 is switched to on-state. This allows for the lower comparison period to start. An A/D conversion begins on the two rightmost bits. Then one of the lower reference voltages, selected by the circuit of lower reference resistors and switches 17 according to the conversion results of the two leftmost bits, is applied to one terminal of each SW5. The lower reference voltages applied to the fourth switches SW5 are obtained by the circuit 17 as a result of equal division of a voltage interval between two upper reference voltages, the interval containing the voltage from the analog input signal source 1.

FOURTH EMBODIMENT

Figure 4:
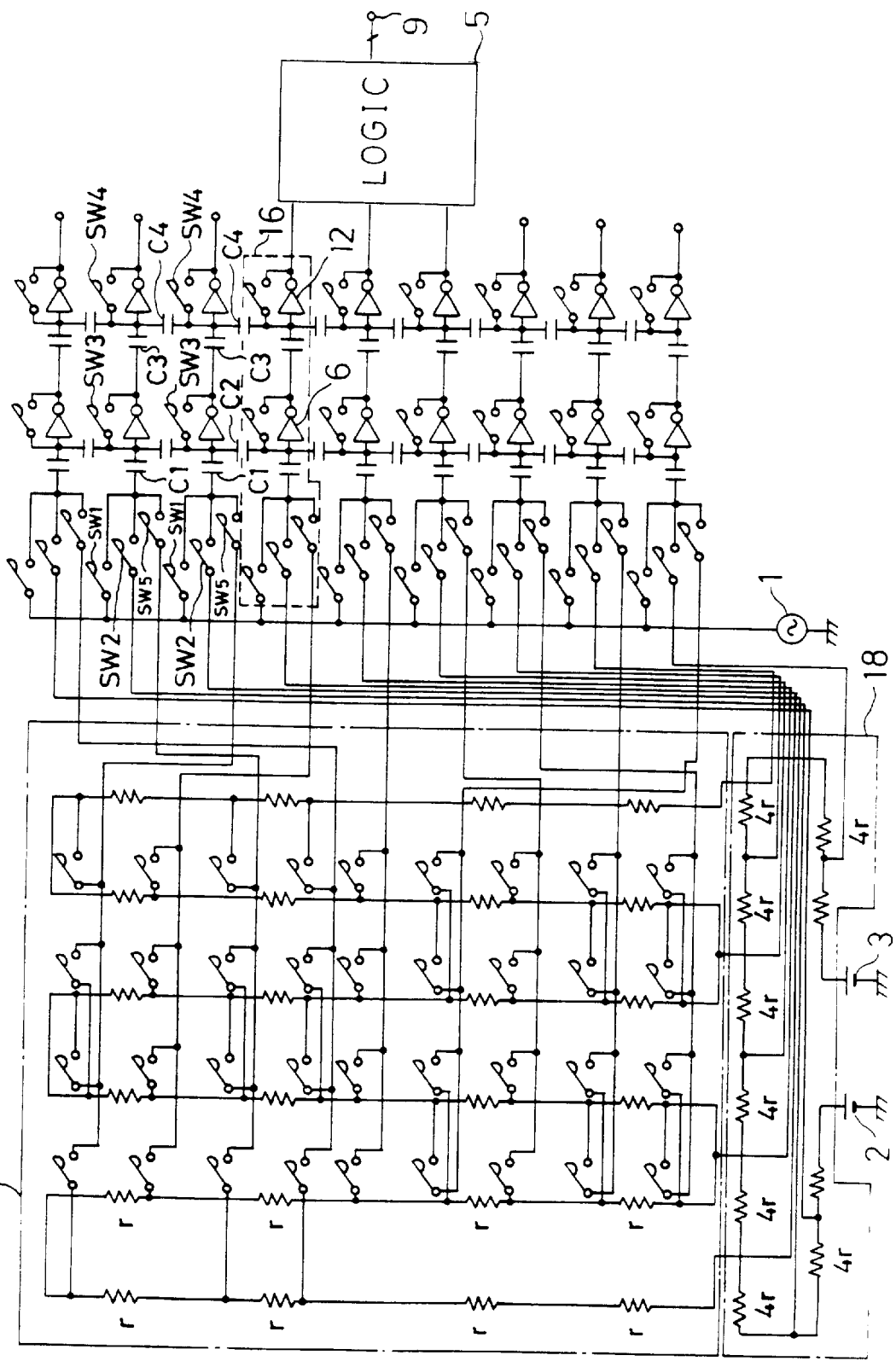
FIG. 4 shows the organization of an ADC of a fourth embodiment of the invention.

Referring now specifically to FIG. 4, the layout of a 4-bit ADC of serial-parallel type in accordance with the fourth embodiment is shown. The comparator 16 of this embodiment has a two-stage inverter configuration so that it contains, in addition to the structural elements shown in FIG. 39 a second coupling capacitor C3, a second inverter 12, and a fourth switch SW4. The output terminal of the first inverter 6 is connected to one terminal of the second coupling capacitor C3. The other terminal of C3 is connected to the input terminal of the second inverter 12. One terminal of SW4 is connected to the input terminal of the second inverter 12 while the other terminal of SW4 is connected to the output terminal of the second inverter 12. Additionally, in this embodiment, each second link capacitor C4 intervenes between joining-points at which one terminal of the second coupling capacitor C3, the input terminal of the second inverter 12, and one terminal of the fourth switch SW4 of each comparator 16 are connected together. The on/off timing of SW1, SW2, SW3, SW4 and SW5 is the same as the one shown in FIG. 7.

FIFTH EMBODIMENT

Figure 5:
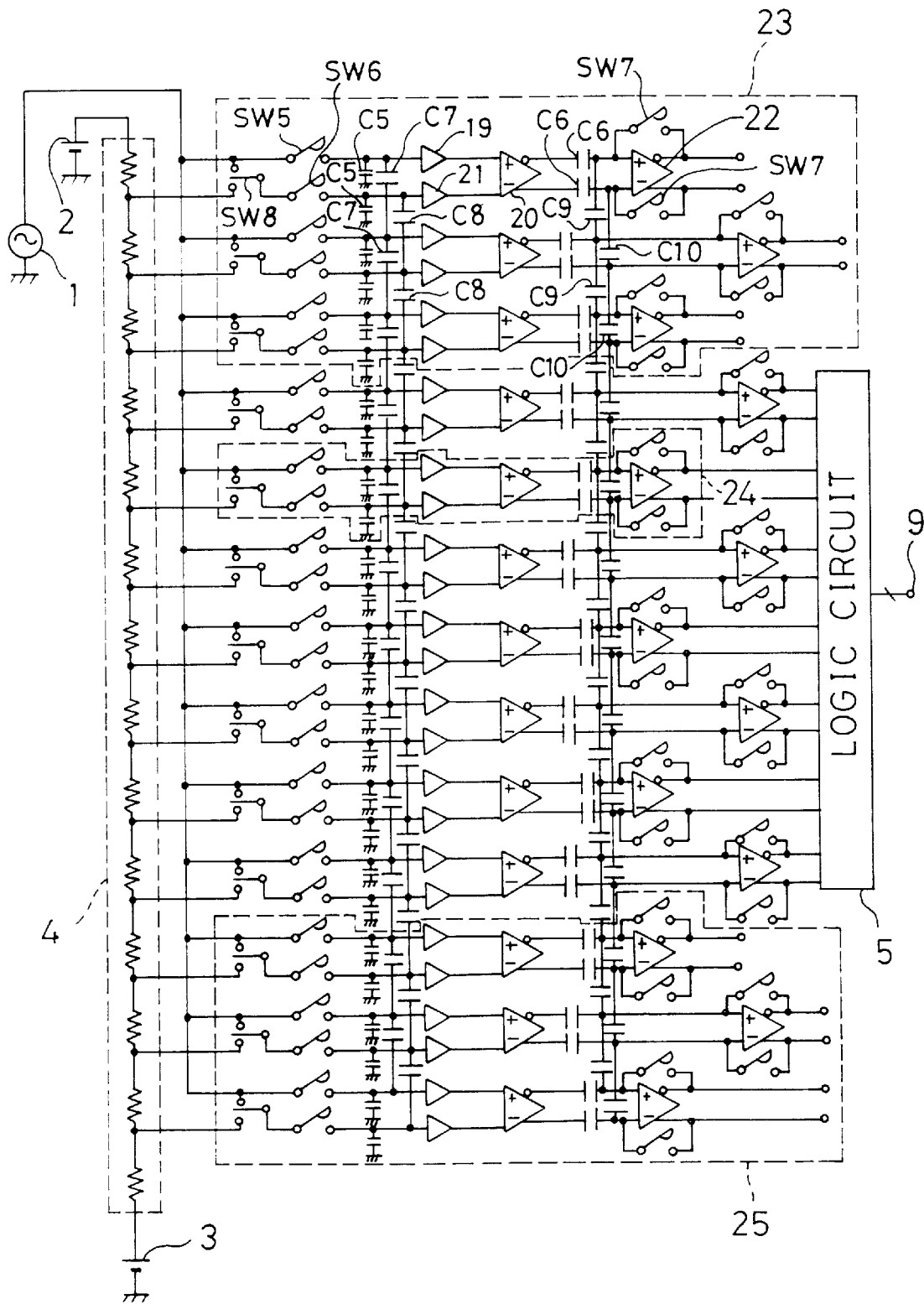
FIG. 5 shows the organization of an ADC of a fifth embodiment of the invention.

Referring now to FIG. 5, the layout of a 3-bit ADC of the fifth embodiment is shown. In this embodiment, the differential chopper comparator takes over from the inverter chopper comparator. A series of reference resistors 4, shown in FIG. 5, divides a potential difference between two reference voltage sources 2 and 3 so as to set the potential differences between every two adjoining terminals of the 13 terminals equal to each other. A comparator array is made up of 13 differential chopper comparators 24 only seven of which at the center are connected, through their respective output terminals, to the logic circuit 5. The output of the logic circuit 5 is an ADC output 9. Three of the comparators 24 at one end of the comparator array constitute a first redundant comparator array 23, and the three at the other end make up a second redundant comparator array 25.

Figure 29:
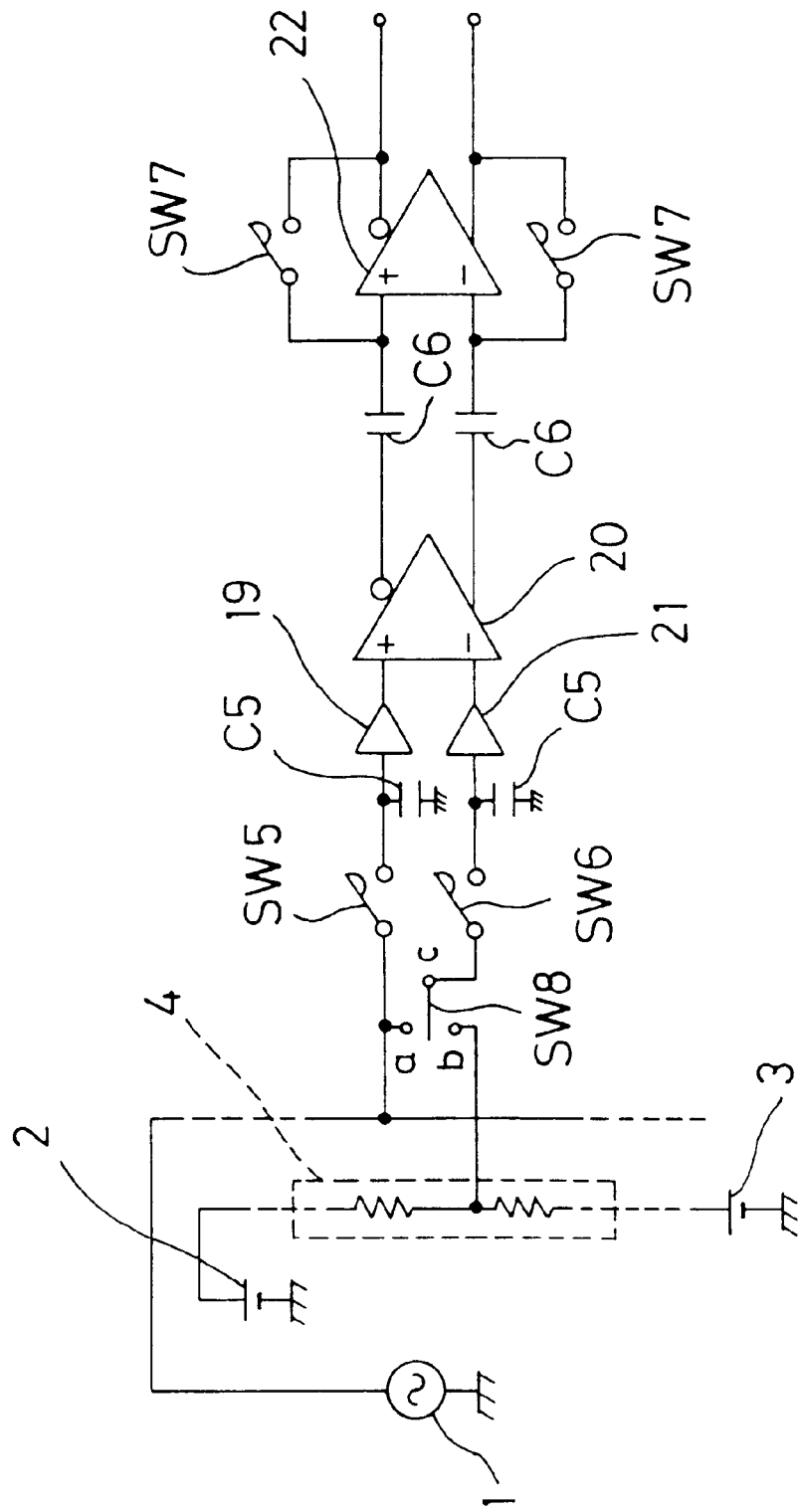
FIG. 29 shows the organization of a conventional differential chopper comparator.
Figure 30A:
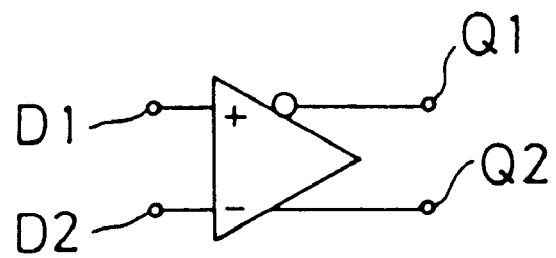
FIGS. 30(a) and (b) show a configuration example for the first and second differential amplifiers of FIG. 29.
Figure 30B:
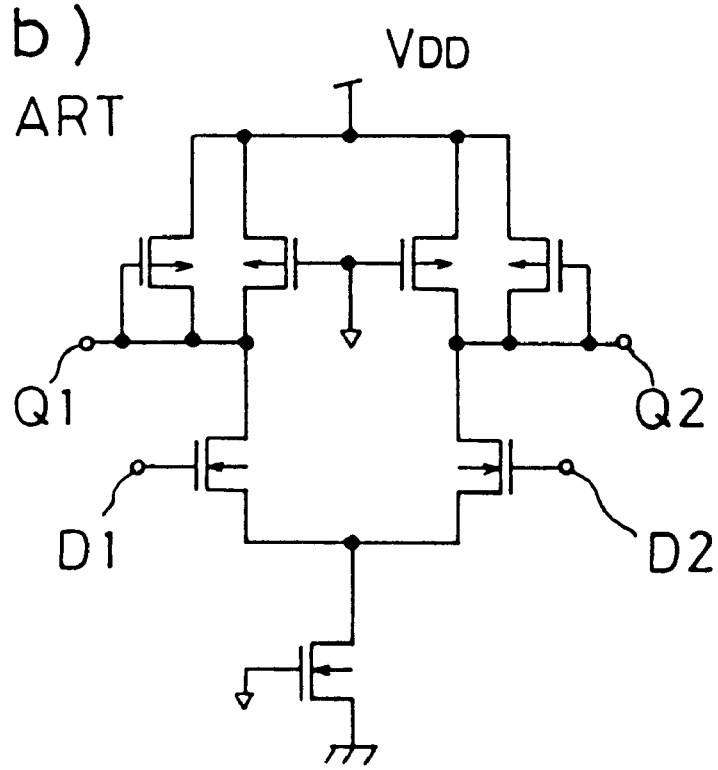
Figure 31:
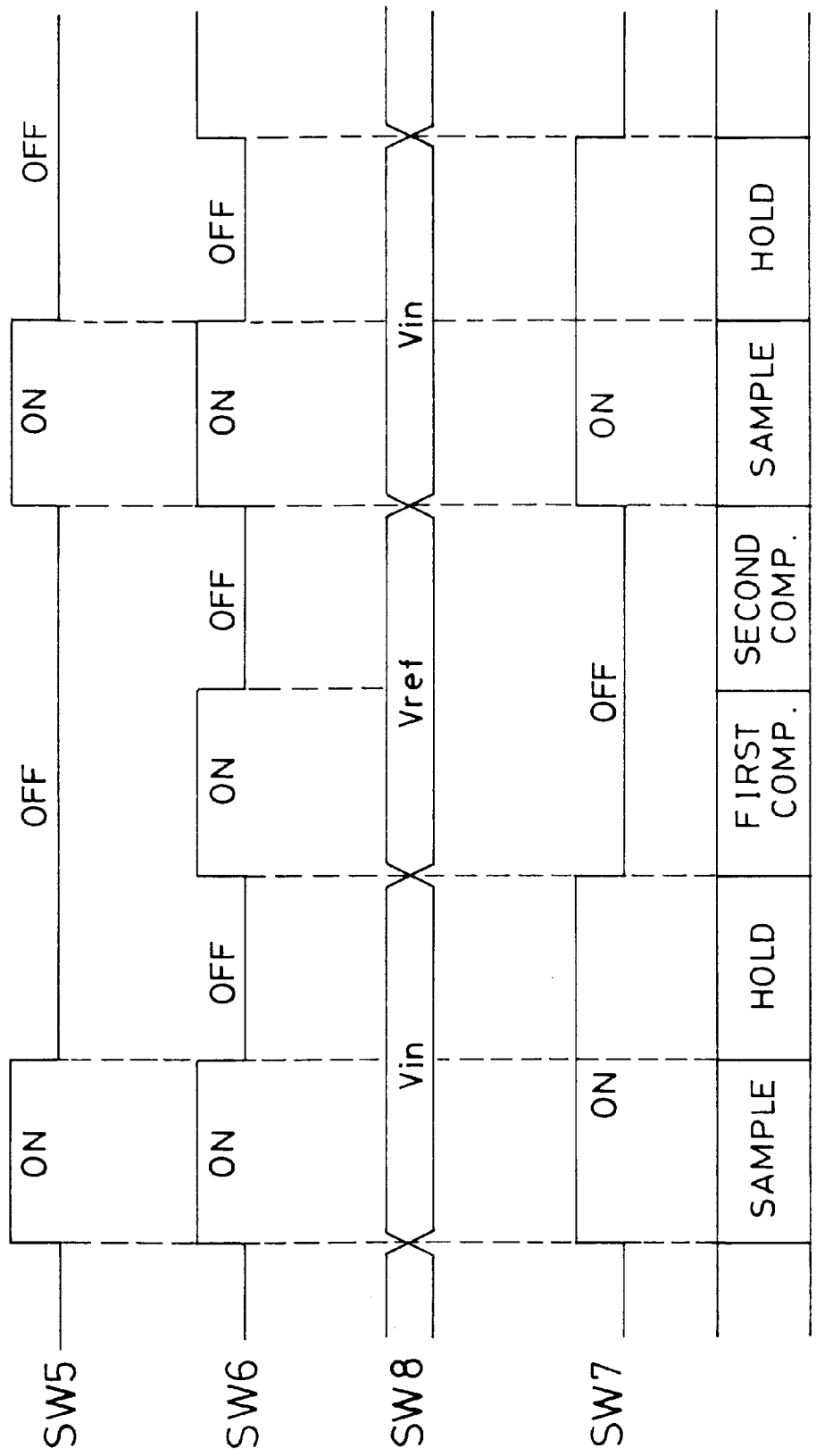
FIG. 31 is the on/off timing diagram of each switch of FIG. 29.

The comparators 24 are each constituted according to FIG. 29. The on/off timing of SW5 through SW8 is shown in FIG. 31. This embodiment further contains four capacitor networks comprised of first to fourth link capacitors C7 through C10, respectively. More specifically, C7, C8, C9, and C10 are intervened between the input terminals of first source followers 19, between the input terminals of second source followers 21, between the non-inverting input terminals of second differential amplifiers 22, and between the inverting input terminals of the second differential amplifiers 22 of every two adjacent comparators 24.

SIXTH EMBODIMENT

Figure 6:
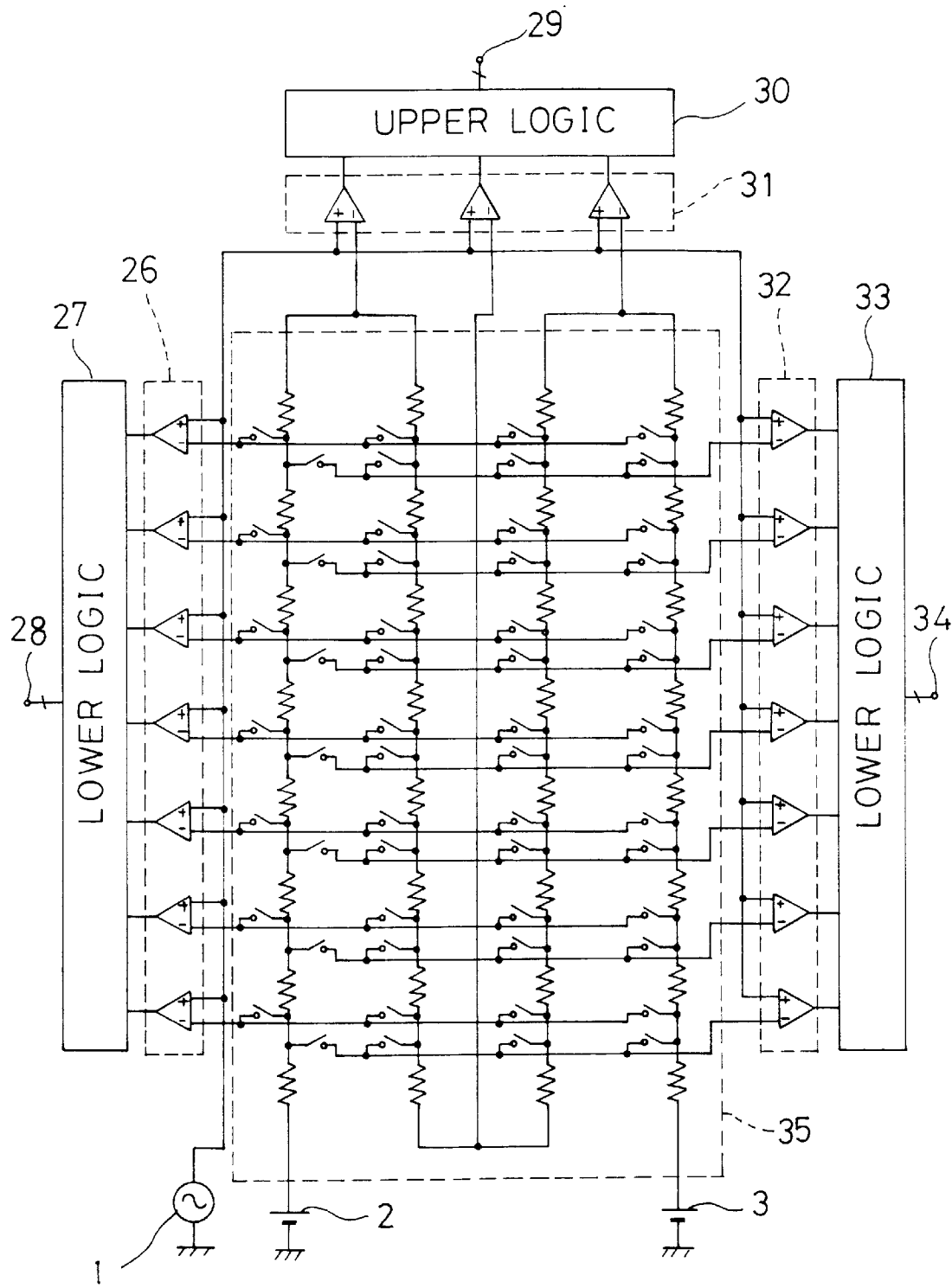
FIG. 6 shows the organization of an ADC of a sixth embodiment of the invention.

Referring to FIG. 6, the layout of a 5-bit ADC of serial-parallel type in accordance with the sixth embodiment is shown. An analog input signal source 1 is connected to an upper comparator array 31, to a first lower comparator array 26, and to a second lower comparator array 32, respectively. Reference voltages generated by a circuit of reference resistors and switches 35 from a potential difference between first and second reference voltage sources 2 and 3 are applied to the three comparator arrays 31, 26, and 32. Precisely speaking, the potential difference between the sources 2 and 3 is equally divided into four voltage intervals. The reference voltages obtained by the equal division are applied to the upper comparator array 31. The output of the upper comparator array 31 is converted into a 2-bit upper ADC output 29 by an upper logic circuit 30. One of the four voltage intervals is selected according to the upper ADC output 29. Seven fine reference voltages, obtained as a result of equal division of the selected voltage intervals, are applied to first and second lower comparator arrays 26 and 32, respectively.

The output of the first lower comparator array 26 is converted into a 3-bit first lower ADC output 28 by a first lower logic circuit 27. The output of the second lower comparator array 32 is meanwhile converted into a 3-bit second lower ADC output 34 by a second lower logic circuit 33. The upper ADC output 29 is merged either to the first lower ADC output 28 or to the second lower ADC output 34 so as to obtain a 5-bit ADC output of this embodiment. Here, the improvement of A/D conversion speed is approached through multiplex operation. Further, the upper comparator array 31, the first lower comparator array 26, and the second lower comparator array 32 are each provided with a capacitor network comprised of link capacitors (not shown) similar to those employed in the foregoing embodiments.

OPERATION AND EFFECTS OF THE EMBODIMENTS

The operation and effects of a capacitor network of the link capacitors C2 are detailed by making reference to the first embodiment (FIG. 1). If the device parameters are adjusted between the comparators 8, there is nothing different from the conventional ADC. This is explained below.

During the sampling period and the holding period. voltages at 13 nodes, represented by Nk (k=−6, . . . , −2, −1, 0, 1, 2, . . . , 6), are Va. Since the voltage, applied across the link capacitor C2, is zero, the link capacitor C2 stores no electric charge at all. This state is equivalent to the one where the link capacitor C2 is not connected between two adjoining nodes Nk+1 and Nk. In other words, during the sampling period, the input capacitance value, viewed from the analog input signal source 1, will not increase, despite the fact that the link capacitor C2 is connected between the adjoining nodes.

During the comparison period, the voltage at Nk (k=−6, . . . , −2, −1, 0, 1, 2, . . . , 6) can be expressed from the formula (3) as follows:

$$VNk = Vrefk - Vin + Va \qquad (6)$$

where Vrefk is the reference voltage being applied to the terminal of SW2 of the comparator 8 having the node Nk.

From the formula (6), the following is given:

$$VNk+1 - VNk = Vrefk+1 - Vrefk = VR \text{ (constant)} \qquad (7)$$

Accordingly, the same voltage is applied across each link capacitor C2. This proves that individual electric charges, stored at two link capacitors C2 both connected to the same Nk, have the same absolute value and opposite signs. The amount of electric charge stored in the coupling capacitor C1 therefore stays unchanged and Vin makes no variations. Accordingly, there is no change to VNk, compared to Vb of the formula (3) for the conventional example, and the connection of link capacitor C2 does not cause the value of VNk to vary. That is, the voltage comparison operation is the same as the one done by the conventional comparator. If there is no variation in the device parameters even though the link capacitor C2 is connected between the comparators 8, this means that there are no ill effects to the comparators.

A case, where unadjustment occurs between the comparators 8, is described. Even if the variation of the device parameters of SW1 and SW3 causes the amount of electric charge, which is injected due to the feedthrough, to vary, the resulting effects of such an ill variation are reduced thereby reducing DNL. This is detailed below.

If the link capacitor C2 is not connected between the comparators 8, this causes the following offset voltage. The electric charge, stored in the coupling capacitor C1 during the sampling period, is expressed by the formula (1), and since the electric charge Qc is injected due to the feedthrough at the time when the sampling period makes a transition to the holding period, the following formulas (8) and (9) hold.

$$C1\ (Vin-Va)=C1\ (Vref-Vb')+Qc \tag{8}$$

$$Vb'=Vref-Vin+Va+Qc/C1 \tag{9}$$

Because of the effect of the injected electric charge Qc, Vb of the formula (3) becomes Vb' of the formula (9). Comparing (3) with (9), the offset voltage Qc/Q1 is apparently added to Vref, resulting in the variation of the threshold voltage of the comparator 8. In other words, the variation of the device parameters causes the variation of the threshold voltage of the comparator. As a result, DNL becomes greater.

Figure 8:
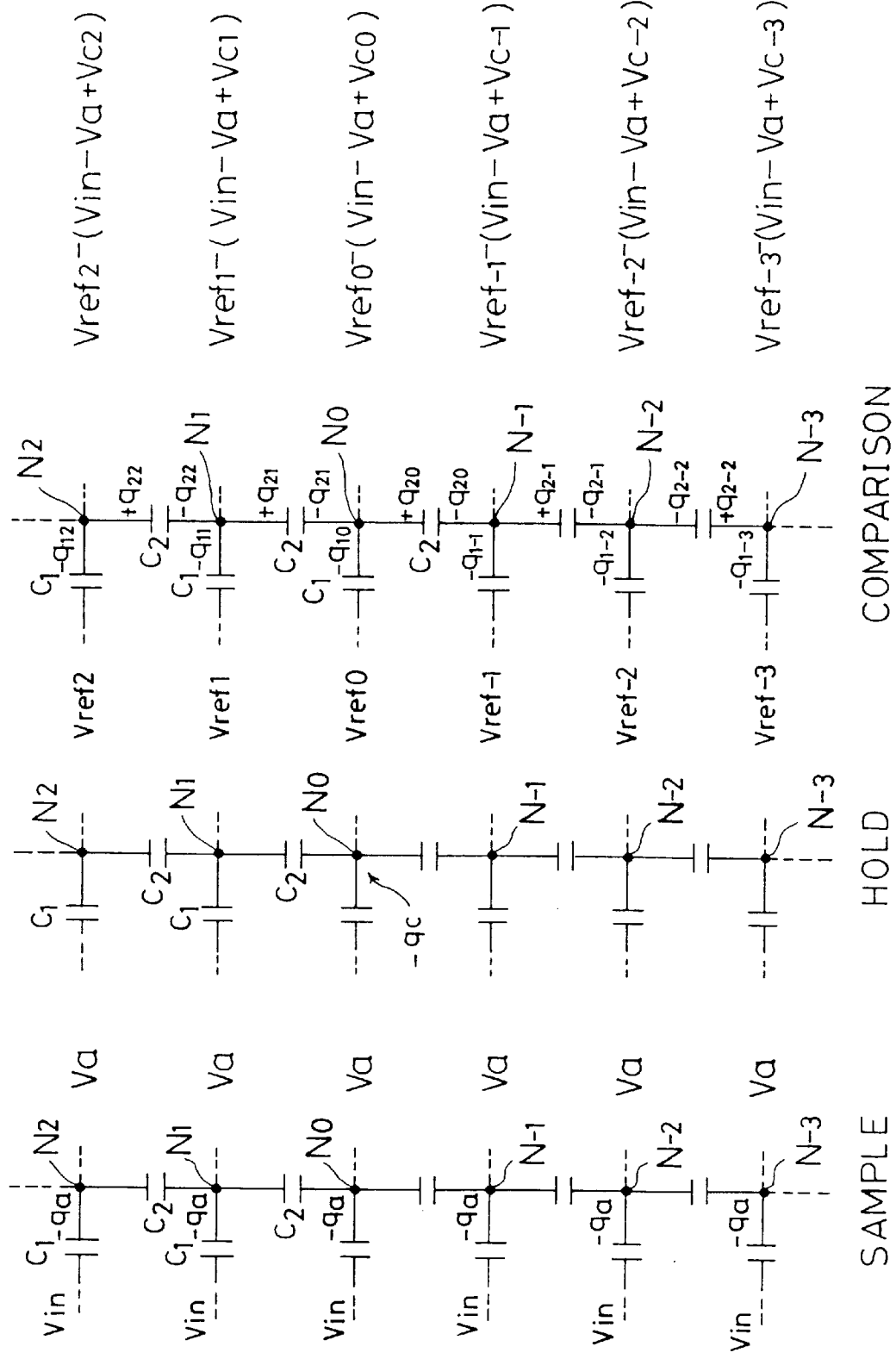
FIGS. 8($a$), ($b$), and ($c$), show charge distribution at different operating states of each comparator in a comparator array with a capacitor network of FIG. 1.

A case, where the link capacitor C2 is connected between the comparators 8, is now illustrated by making reference to FIG. 8.

During the sampling period, the link capacitor C2 is not exerted by low frequency input signals. The comparators 8 are each charged with an equal amount of electric charge. This equally moves the threshold voltage of each comparator. DNL therefore will not increase. It is here assumed that the electric charge (−qc) is injected to the node N0, which is unadjustable with the all other nodes at the time when the sampling period makes a transition to the holding period. DNL due to the variation in the amount of electric charge, (−qc) will be described.

During the comparison period, the voltage VNk at the node Nk is expressed by:

$$VNk=Vrefk-(Vin-Va+Vck) \tag{10}$$

where Vck is the offset voltage due to the feedthrough.

Finding Vck of the formula (10) makes it possible to calculate DNL. In view of this, Vck is first to be obtained.

The electric charge conservation formulas for the central node N0 are:

$$q21=C2\ VR+qc2 \tag{11}$$

$$q20=C2\ VR-qc3 \tag{12}$$

$$q10=qa+qc1 \tag{13}$$

where:

$$qa=C1\ (Vin-Va)$$

$$qc=qc1+qc2+qc3 \tag{14}$$

Since there are no movement of electric charge after the comparison period begins in which the voltages at each node become stable, the nodes are divided at the node N0 for calculation. With regard to the electric charge stored in the coupling capacitor C1 connected to the central node N0, the following is given from the formula (13).

$$C1\ (Vin-Va+Vc0)=qa+qc1 \tag{15}$$

Therefore, $$Vc0=qc1/C1 \tag{16}$$

Next, the higher potential nodes of N1, N2, N3, etc. than the central node N0 are considered. With regard to the electric charge of the link capacitor C2 connected to the central node N0, the following is given from the formula (11).

$$C2\ (VR-Vc1+Vc0)=C2VR+qc2 \tag{17}$$

Therefore, $$-Vc1+Vc0=qc2/C2 \tag{18}$$

Since at the higher potential nodes N1, N2, N3, etc., qc=0, the electric charge conservation formula at the node Nk (k=1, 2, 3, ..., 6) is:

$$-q1k=q2k+1+q2k=-qa \tag{19}$$

From the terminal voltage of the capacitor connected to the node Nk, the formula (19) becomes:

$$-C1\ (Vin-Va+Vck+1)-C2\ (VR-Vck+2+Vck+1)+C2\ (VR-Vck+1+Vck)=-qa \tag{20}$$

To make the formula (20) simpler, it can be rewritten as follows:

$$Vck+2-a\ Vck+1+Vck=0 \tag{21}$$

where a=2+r and r=C1/C2.

(21) can be transformed as follows:

$$Vck+2-\alpha Vck+1=\beta(Vck+1-\alpha Vck) \tag{22}$$

$$Vck+2-\beta Vck+1=\alpha(Vck+1-\beta Vck) \tag{23}$$

Since (22) and (23) are geometrical series, they may be expressed as follows:

$$Vck+1-\alpha Vck=\beta^k\ (Vc1-\alpha Vc0) \tag{24}$$

$$Vck+1-\beta Vck=\alpha^k\ (Vc1-\beta Vc0) \tag{25}$$

(24) and (25) are simultaneously held to find Vck, which is as follows:

$$Vck=1/(\beta-\alpha)\ \{\beta^k(Vc1-\alpha Vc0)-\alpha^k(Vc1-\beta Vc0)\} \tag{26}$$

where k=1, 2, 3, ...

$$\alpha=\{2+r+(r^2+4r)^{1/2}\}/2>1$$

$$\beta=\{2+r-(r^2+4r)^{1/2}\}/2<1$$

Next, the lower potential nodes of N−1, N−2, N−3, etc. than the central node N0 are considered. With regard to the electric charge of the link capacitor C2 connected to the central node N0, the following is given from the formula (12).

$$C2\ (VR-Vc0+Vc-1)=C2VR-qc3 \tag{27}$$

Therefore, $$-Vc-1+Vc0=qc3/C2+\text{tm} (28)$$

Since, at the nodes N−1, N−2, N−3, etc., qc=0, the electric charge conservation formula at each node N−k (k=1, 2, 3, ..., 6) is:

$$-q_{1-k} - q_{2-(k+1)} + q_{2-k} = -qa \quad (29)$$

From the terminal voltage of the capacitor connected to the node N–k, the formula (29) becomes:

$$-C1\ (Vin-Va+Vc-(k+1))-C2\ (VR-Vc-(k+2)+Vc-(k+1))+C2\ (VR-Vc-(k+1)+Vc-k)=-qa \quad (30)$$

To make the formula (30) simpler, it can be rewritten as follows:

$$Vc-(k+2) - aVc-(k+1) + Vc-k = 0 \quad (31)$$

This (31) can be expressed with a geometrical series, as in the formula (21), as follows:

$$Vc-k = 1/(\beta-\alpha)\{\beta^k(Vc-1-\alpha Vc0) - \alpha^k(Vc-1-\beta Vc0)\} \quad (32)$$

where $k = 1, 2, 3, \ldots$

If both the coupling capacitors C1 and the link capacitors C2 infinitely exist, the offset voltage due to $-qc$ becomes zero at a point very much far from the central node N0, this makes the following hold.

$$Vck = 0\ (k \to \infty),\ Vc-k = 0\ (k \to \infty) \quad (33)$$

The formulas (26) and (32) satisfy the formula (33) with the following requirements:

$$Vc1 - \beta Vc0 = 0 \quad (34)$$

$$Vc-1 - \beta Vc0 = 0 \quad (35)$$

By making the formulas (14), (16), (18), (26), (28), (32), (34), and (35) simultaneously hold, the following are obtained.

$$Vck = \beta^k qc/\{C1 + 2C2\ (1-\beta)\} \quad (36)$$

where $k = 0, 1, 2, 3$, etc., and $$Vc-k = \beta^k qc/\{C1 + 2C2\ (1-\beta)\} \quad (37)$$

where $k = 1, 2, 3, \ldots$

From the above calculation, the offset voltage, Vck ($k = -6, \ldots, -2, -1, 0, 1, 2, \ldots, 6$) in the formula (10) was found by the formulas (36) and (37).

If the analog input voltage Vin is between two adjoining reference voltages Vrefk and Vref(k−1) where $k = 1, 2, 3, \ldots$, an ADC output is given as Code<k>, and if Vin is between Vref(−k+1) and Vref(−k) where $k = 1, 2, 3, \ldots$, an ADC output is given as Code<−k.>. If Code<1> is a missing code in the case that link capacitors C2 are not connected to the comparators 8, the following formulas hold.

$$-Vc0 = -qc/C1 = VR \quad (38)$$

$$qc = -C1\ VR \quad (39)$$

If link capacitors C2 are connected to the comparators 8, the following formula holds.

$$(VR - Vck + Vck-1)/VR = 1 + (-Vck + Vck-1)/VR \quad (40)$$

The second term of the right side of (40) represents the differential nonlinearity error (i.e., DNL). The formula (40) is made simpler using the formulas (36), (37), and (39), as follows:

$$DNL(Code<k>) = (-Vck + Vck-1)/VR = -C1\beta^{k-1}(1-\beta)/\{C1 + 2C2\ (1-\beta)\} \quad (41)$$

where $k = 0, 1, 2, 3, \ldots$ $$DNL(Code<-k>) = (-Vck + Vck-1)/VR = C1\beta^{k-1}(1-\beta)/\{C1 + 2C2\ (1-\beta)\} \quad (42)$$

where $k = 1, 2, 3, \ldots$

ECF (Error Correction Factor), as an index of representing the degree of improvement in DNL, is defined by the following formula.

$$ECF = 100\ (1 - DNLc/DNLuc) \quad (43)$$

where DNLc and DNLuc represent the corrected DNL (max) and the uncorrected DNL (max), respectively. If DNLuc = 1LSB, a case of the formula (41) where $k = 1$ is applied to DNLc. Therefore, the formula (43) may be rewritten as follows:

$$ECF = 100\ [1 - r(1-\beta)/\{r + 2\ (1-\beta)\}], \quad (44)$$

where $r = C1/C2$.

Figure 9:
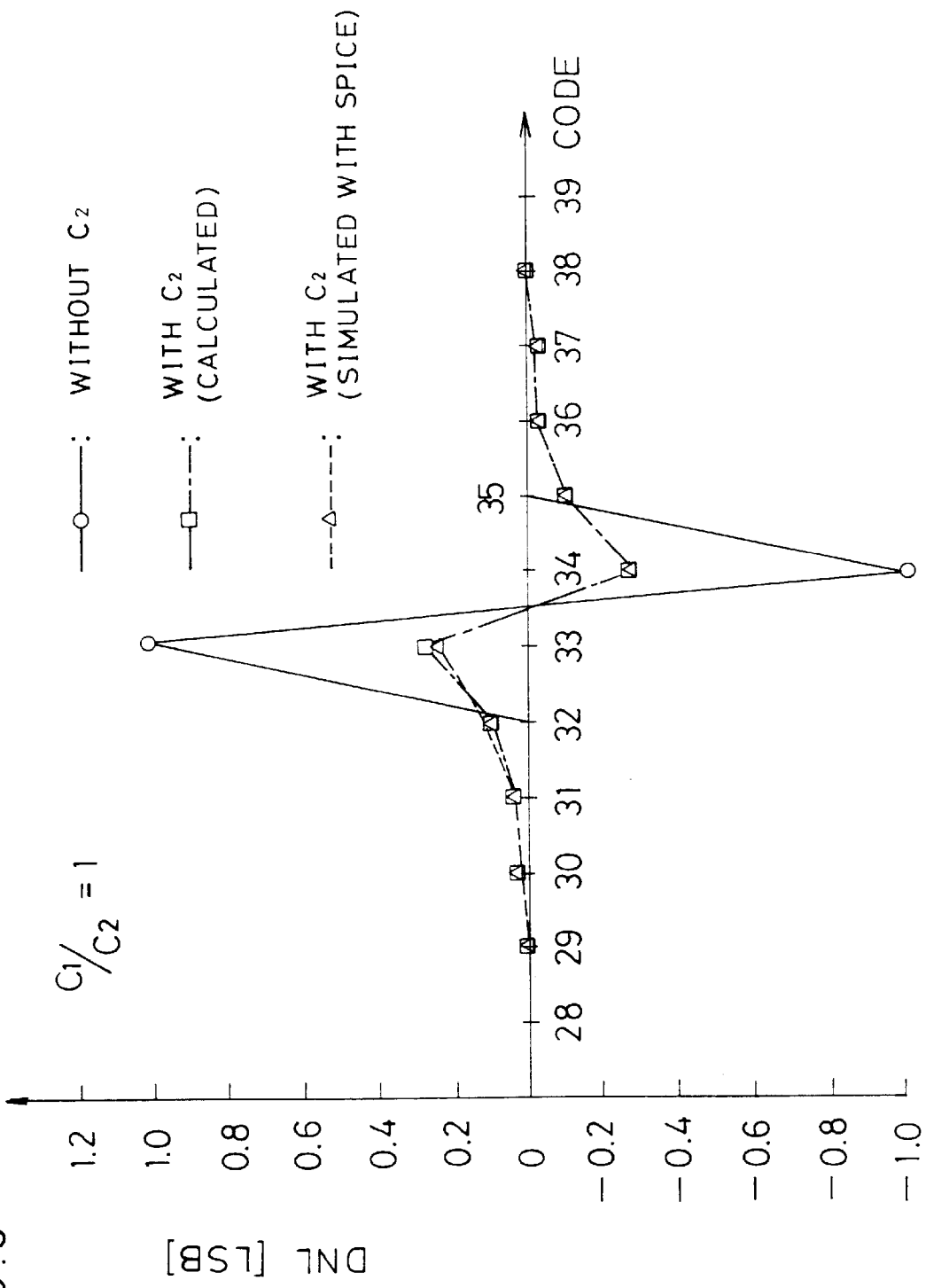
FIG. 9 shows how the capacitor network improves DNL at the time when a one-place missing code occurs in the ADC of FIG. 1.
Figure 10:
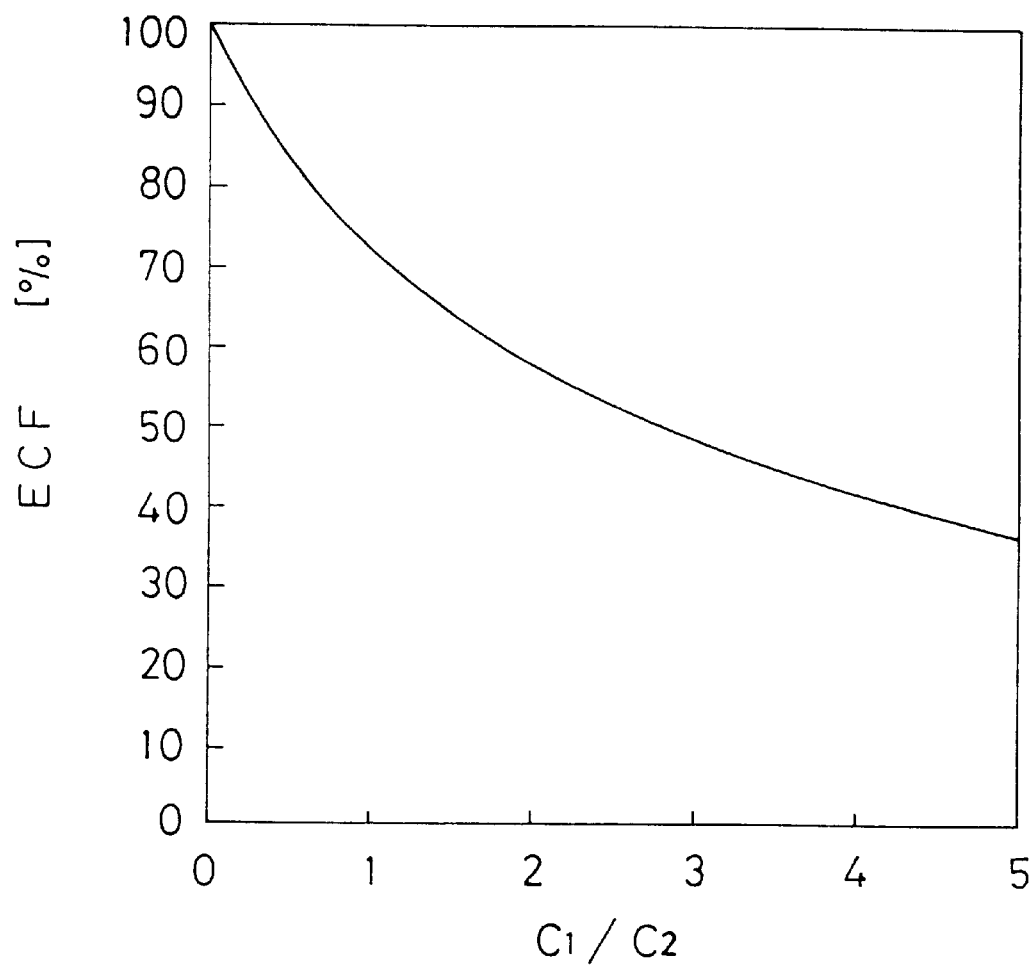
FIG. 10 shows the relation of C1/C2 versus ECF (Error Correction Factor), in the ADC of FIG. 1.

FIG. 9 shows how an ADC, in which the unadjustment in electric charge causes the condition of missing code at one place when the link capacitors C2 are not connected between comparators, improves DNL by connecting the link capacitors C2 between them. As seen from the figure, −1LSB is reduced down to −0.28LSB, or DNL is improved by 72 percent. FIG. 10 shows the relation of C1/C2 versus ECF. If C1/C2 = 1, DNL is reduced by 72 percent. If C1/C2 = 2, it is reduced by 58 percent. The above calculation results were obtained by assuming that limitless numbers of coupling capacitors C1 and link capacitors C2 are connected. However, the offset voltage, Vck becomes almost zero at Vc5 and Vc−5. It is therefore possible to apply these calculation results to such a case where five or more comparators are connected at each side of one comparator injected with −qc. A simulation by means of SPICE (a simulation program with integrated circuit emphasis) was carried out by producing unadjustment in the device parameters of one of 11 comparators at the center. This simulation confirmed the foregoing calculation results.

Figure 11:
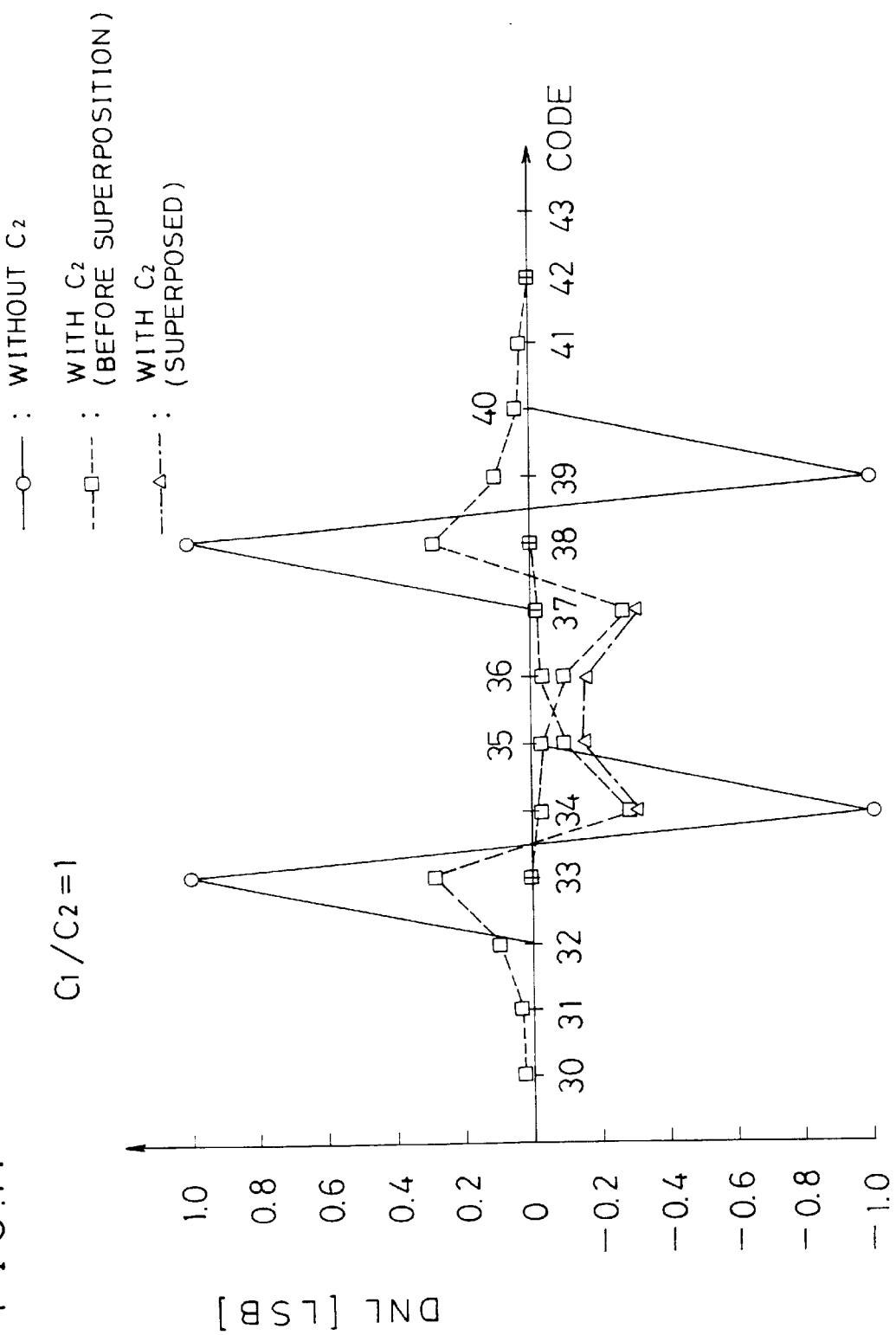
FIG. 11 shows how the capacitor network improves DNL at the time when a two-place missing code occurs in the ADC of FIG. 1.

Because of a linear network, it allows for the principle of superimposition to hold. Not only when variations in threshold voltage intensively appear at a single particular comparator, but also when they appear even at two or more comparators, it is possible to perform calculations assuming that errors are occurring at only one of them and by adding results calculated on each comparator. FIG. 11 shows how the link capacitors C2 improve DNL at the time when electric charge that will cause an error of ADC output is injected into two comparators. It is proved that, even if the threshold voltages of a plurality of comparators vary, the effects of such variations can be suppressed. DNL is improved, accordingly.

These calculation results are ones in the case that the amounts of electric charge injected from each switch vary. However, because of Q = CV where Q is the amount of electric charge, C is the capacitance, and V is the terminal voltage of a capacitor, and further because of a linear network, it is possible to replace the variation in the amount of electric charge with the variation in the coupling capacitors C1 and the link capacitors C2. Accordingly, even though the capacitances of coupling capacitors C1 and link capacitors C2 vary, DNL can be improved for the same reason. Further, even though the reference resistances vary, resulting in causing the reference voltages to vary, DNL can likewise be improved.

A simulation by means of SPICE was carried out to verify the effects of the variations in capacitance of coupling capacitors C1 and link capacitors C2 on DNL degradation, when C1/C2 = 1. Table shows the degree of DNL degradation when one coupling capacitor C1 increases 10 percent in its capacitance value as well as the degree of DNL degradation when one link capacitor C2 increases 10 percent in its capacitance value. The degree of DNL degradation is considerably less affected when the capacitance of C2 increases, as compared to when the capacitance of coupling capacitor C1 increases. Since the degree of DNL degradation when C2 increases is within the range of simulation error, it is expressed as "below 0.1LSB" in Table. This indicates that the effect due to the variation of C1 is very much less than that due to the variation of C2. This proves that even though C2 is varies, resulting in the degradation of DNL, the resulting degradation degree is too small to consider.

TABLE

| Increment in Capacitance | Amount of DNL Degradation |
|---|---|
| Cap. value of C1 increases by 10%. | 0.4 LSB |
| Cap. value of C2 increases by 10%. | below 0.1 LSB |

Since a capacitor element can be arranged between comparator constituents, this nearly prevents the area of the chip from increasing. Further, by scattering the produced electric charge through the link capacitors, the foregoing effects can be obtained without depending on power-supply voltage. Therefore, the like effects can be obtained at a low power-supply voltage.

In FIG. 1, seven comparators, connected to Vrefk (k=−3, −2, −1, 0, 1, 2, 3), are ones required also in constituting a conventional 3-bit ADC. Besides these seven comparators, the first embodiment further includes the first and second redundant comparator arrays 7 and 11.

In the case that these redundant comparator arrays 7 and 11 are not connected, the comparators with connection to Vref3 and Vref−3 are each connected to one link capacitor C2 and the movement of electric charge, during the comparison period, is different from the movement at all other comparators. The terminals of link capacitors C2 connected to N3 and N−3 are not connected to another link capacitor C2. Electric charge stored at corresponding coupling capacitors C1 moves, which makes Vin sampled vary. The first and second redundant comparator arrays 7 and 11 are provided so as to reduce the variation in Vin at both ends. For the aforesaid reason, Vin varies at the respective endmost comparators of the first and second redundant comparator arrays 7 and 11. In order to prevent this ill effect from making the threshold voltage errors of the central seven comparators for 3-bit A/D conversion greater, the redundant comparator arrays 7 and 11 each require a plurality of comparators. The provision of the link capacitors C2 requires no additional power dissipation for itself. On the other hand, the provision of the redundant comparator arrays 7 and 11 requires some additional power dissipation in the ADC.

Figure 12:
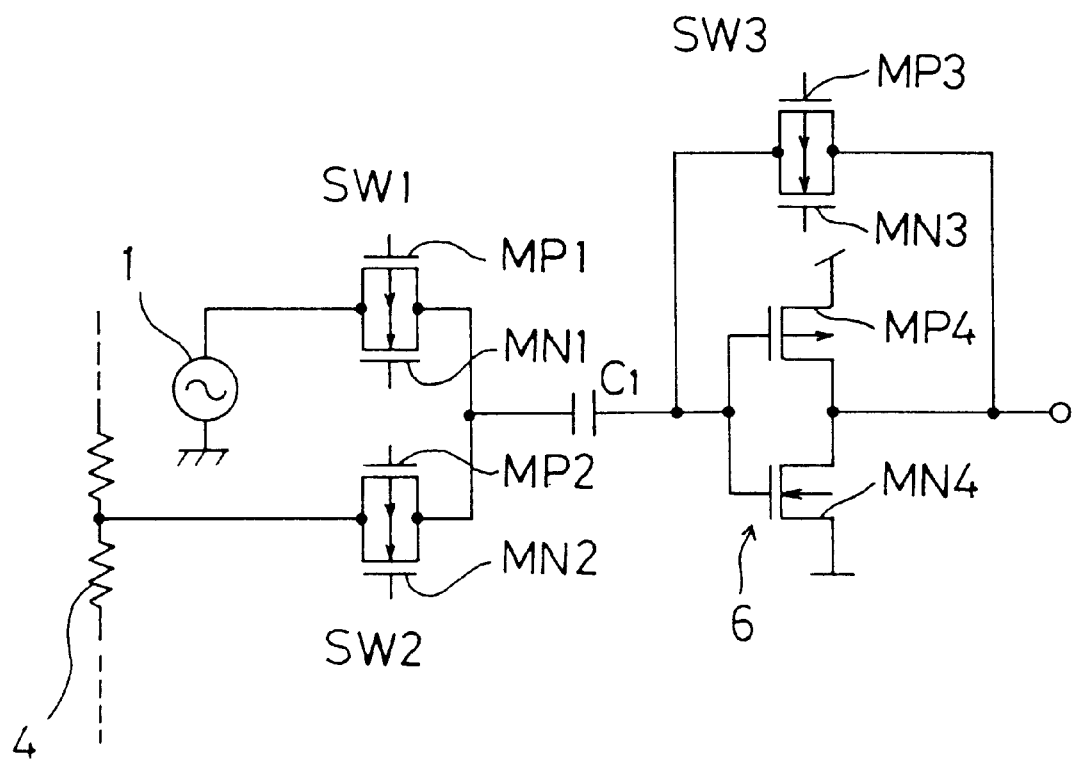
FIG. 12 illustrates in detail a circuit diagram of one of the inverter chopper comparators of FIG. 1.

In accordance with the embodiment, the frequency characteristics of the ADC can be improved, which is described by reference to FIG. 12 to FIG. 15. The comparator 8, shown in FIG. 1, has four pairs of MOS transistors MP1 and MN1, MP2 and MN2, MP3 and MN3, and MP4 and MN4 of FIG. 12. The analog input signal source 1 is connected to the drains of MP1 and MN1 together making up SW1. MP2 and MN2, making up SW2, are connected to a series of reference resistors 4. During the sampling period, both the pair of MP1 and MN1 and the pair of MP3 and MN3 that constitute SW3 are in on-state, while on the other hand the pair of MP2 and MN2 are in off-state. The constants in an AC equivalent circuit to that of FIG. 12, shown in FIG. 13, can be expressed as follow:

$$rd1 = rp1 + rn1 \quad (45)$$

where rp1 is the on-state drain-to-source resistance of MP1, and rn1 is the on-state drain-to-source resistance of MN1;

$$rd2 = rp2 + rn2 \quad (46)$$

where rp2 is the on-state drain-to-source resistance of MP2, and rn2 is the on-state drain-to-source resistance of MN2;

$$Cs = Cgdp2 + Cgdn2 \quad (47)$$

where Cgdp2 is the gate-to-drain capacitance of MP2, and Cgdn2 is the gate-to-drain capacitance of MN2;

$$gm = gmp4 + gmn4 \quad (48)$$

where gmp4 is the mutual conductance of MP4, and gmn4 is the mutual conductance of MN4; and $$R0 = rdp4 \, rdn4/(rdp4 + rdn4) \quad (49)$$

where rdp4 is the output resistance of MP4, and rdn4 is the output resistance of MN4.

Figure 14:
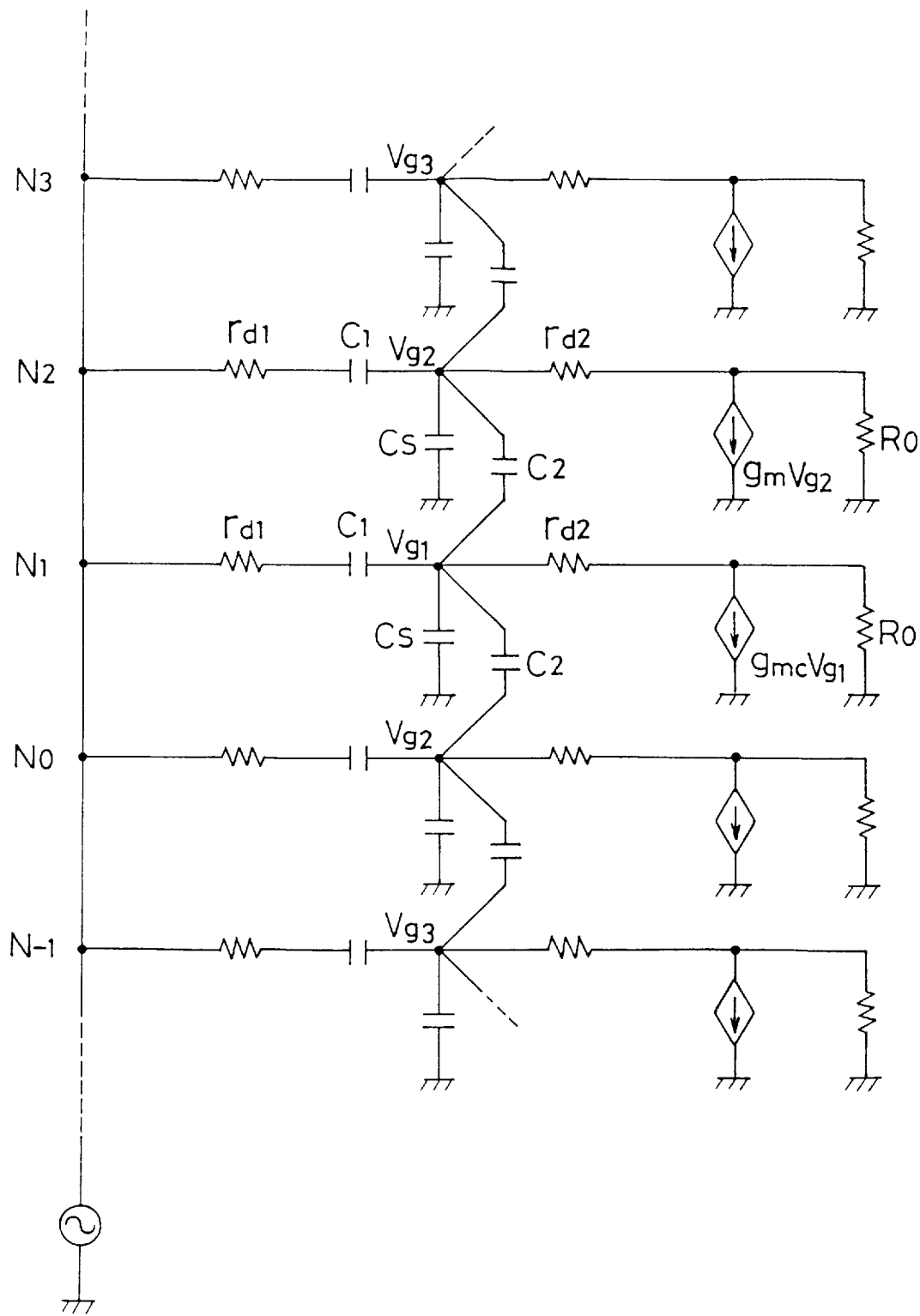
FIG. 14 is an a.c. equivalent circuit diagram of an array of invertrer chopper comparators with a capacitor network of FIG. 1.

In FIG. 14, the AC equivalent circuit to the comparator array 10 with a capacitor network of FIG. 1 is illustrated. A case is detailed below, in which gm (i.e. the sum of the mutual conductance of MP4 and the mutual conductance of MN4, expressed by the formula (49) for a comparator connected to the node N1) becomes a lower value of gmc, as compared to a comparator connected to another node, due to a variation in device parameters. It is here assumed that, in a transfer function, the main pole is considerably lower than the other non-main poles so that the non-main poles can be disregarded. To computing the approximation of the main pole, the zero-value time constant analysis is used.

The zero-value time constant of each capacitor of the comparator connected to the first node N1 is first found.

Figure 15A:
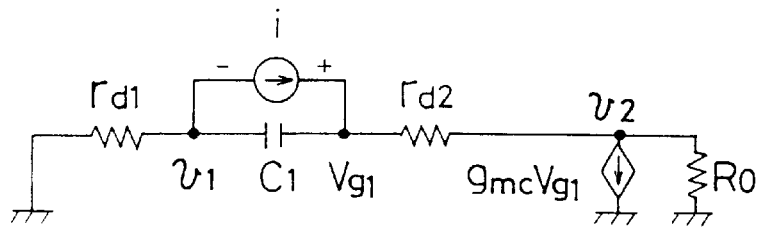
FIGS. 15($a$), ($b$), ($c$), and ($d$) show a process of circuit analysis for FIG. 14.

To find resistance R1c0 viewed from the coupling capacitor C1, a current source is connected as shown in FIG. 15(a). v1 and v2 are expressed by:

$$v1 = -rd1 \, i \quad (50)$$

$$v2 = Vg1 - rd2 \, i \quad (51)$$

where i represents the current value of the current source. Further, the formula:

$$R1c0 = (Vg1 - v1)/i \quad (52)$$

holds. Furthermore, the following is given by Kirchhoff's laws.

$$i - gmc \, Vg1 - v2/R0 = 0 \quad (53)$$

If the formulas (50), (51), (52), and (53) are simultaneously held to find R1c0, this becomes:

$$R1c0 = (1 + rd2/R0)/(1/R0 + gmc) + rd1 \quad (54)$$

Since R0>rd2>1, the formula (54) can be approximated, as follows:

$$R1c0 = 1/gmc + rd1 \quad (55)$$

Therefore, the zero-value time constant of C1 is:

$$C1 \, R1c0 = C1 \, (1/gmc + rd1) \quad (56)$$

Figure 15B:
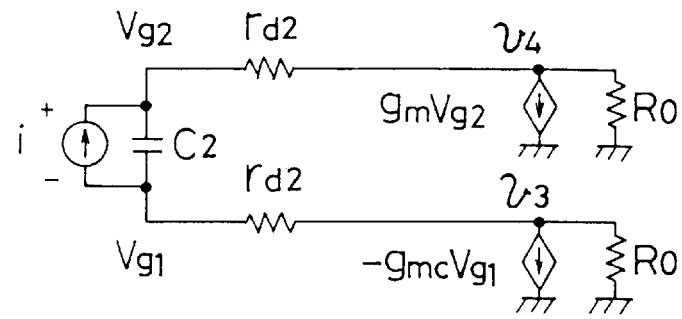

To find resistance R2c0 viewed from the link capacitor C2, a current source is connected as shown in FIG. 15(b). v3 and v4 are expressed by:

$$v3 = ird2 + Vg1 \tag{57}$$

$$v4 = -ird2 + Vg2 \tag{58}$$

Furthermore, the following are given by Kirchhoff's laws.

$$-i + gmcVg1 - v1/R0 = 0 \tag{59}$$

$$i - gmVg2 - v2/R0 = 0 \tag{60}$$

$$R2c0 = (Vg2 - Vg1)/i \tag{61}$$

If the formulas (57), (58), (59), (60), and (61) are simultaneously held to find R2c0, this becomes:

$$R2c0 = (1 + rd2/R0)/(gm + 1/R0) - (1 + rd2/R0)/(gmc + 1/R0) \tag{62}$$

Since R0>rd2>1, the formula (62) can be approximated, as follows:

$$R2c0 = (gmc - gm)/(gmcgm) \tag{63}$$

Therefore, the zero-value time constant of C2 is:

$$C2\ R2c0 = C2\ (gmc - gm)/(gmcgm) \tag{64}$$

Figure 15C:
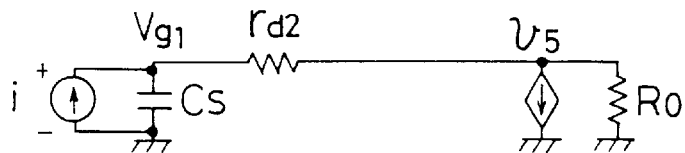

To find resistance Rsc0 viewed from the gate-to-drain capacitance Cs of SW2, a current source is connected as is shown in FIG. 15(c). v5 is expressed by:

$$v5 = Vg1 - rd2i \tag{65}$$

Further, the following:

$$Rsc0 = Vg1/i \tag{66}$$

holds. Furthermore, the following is given by Kirchhoff's laws.

$$i - gmcVg1 - v5/R0 = 0 \tag{67}$$

If the formulas (65), (66), and (67) are simultaneously held to find Rsc0, this gives:

$$Rsc0 = (1 + rd2/R0)/(gmc + 1/R0) \tag{68}$$

Since R0>1, the formula (68) can be approximated, as follows:

$$Rsc0 = 1/gmc \tag{69}$$

Therefore, the zero-value time constant of Cs of SW2 is:

$$Cs\ Rsc0 = Cs/gmc \tag{70}$$

The zero-value time constant of each capacitor of the comparator connected to the second node N2 next to the first node N1 are found.

Figure 15D:
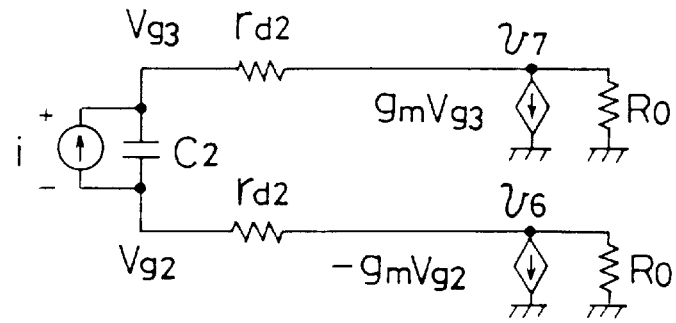

To find resistance R20 viewed from the link capacitor C2, a current source is connected, which is shown in FIG. 15(d). v6 and v7 are expressed by:

$$v6 = Vg2 - ird2 \tag{71}$$

$$v7 = Vg3 + ird2 \tag{72}$$

Further, the following:

$$R20 = (Vg2 - Vg3)/i \tag{73}$$

holds. Furthermore, the following are given by Kirchhoff's laws.

$$i - gmVg2 - v6/R0 = 0 \tag{74}$$

$$-i + gmVg3 - v7/R0 = 0 \tag{75}$$

If the formulas (71), (72), (73), (74), and (75) are simultaneously held to find R20, this gives:

$$R20 = 0 \tag{76}$$

Therefore, the zero-value time constant of C2 is:

$$C2\ R20 = 0 \tag{77}$$

Since the circuit used for finding resistance R10 and resistance Rs0 viewed from C1 and Cs is the same as above, the zero-value time constants become equal to a case where C1 and Cs of the comparator are connected to the first node N1. Hence, $$C1\ R10 = C1\ R1c0 \tag{78}$$

$$Cs\ R20 = Cs\ R2c0 \tag{79}$$

The zero-value time constant b1 for N comparators can be given by:

$$b1 = C1\ R1c0 + 2C2\ R2c0 + (N-1)C1\ R10 + NCs\ R2c0 \tag{80}$$

Meanwhile, the zero-value time constant b2 in the case that link capacitors C2 are not provided can be given by:

$$b2 = C1\ R1c0 + (N-1)\ C1\ R10 + NCs\ R2c0 \tag{81}$$

Since gmc<gm, this leads to: C2 R2c0<0. Therefore, b1<b2.

Further, the −3 dB frequency, f1(−3 dB) at the time when link capacitors C2 are provided, and the −3 dB frequency, f2(−3 dB) at the time when link capacitors C2 are not provided are expressed respectively, as follows:

$$f1(-3\ dB) = 1/(2\pi b1) \tag{82}$$

$$f2(-3\ dB) = 1/(2\pi b2) \tag{83}$$

From (82) and (83), f1(−3 dB)>f2(−3 db). This proves that the frequency characteristics can be improved when link capacitors C2 are provided. The degradation of frequency characteristics due to the variation in device parameters is improved because of the presence of link capacitors C2. In addition, the foregoing advantages are obtained through capacitors which are passive elements, without depending upon a power-supply voltage. Therefore, the like effects can be obtained even at a low power-supply voltage.

Figure 16:
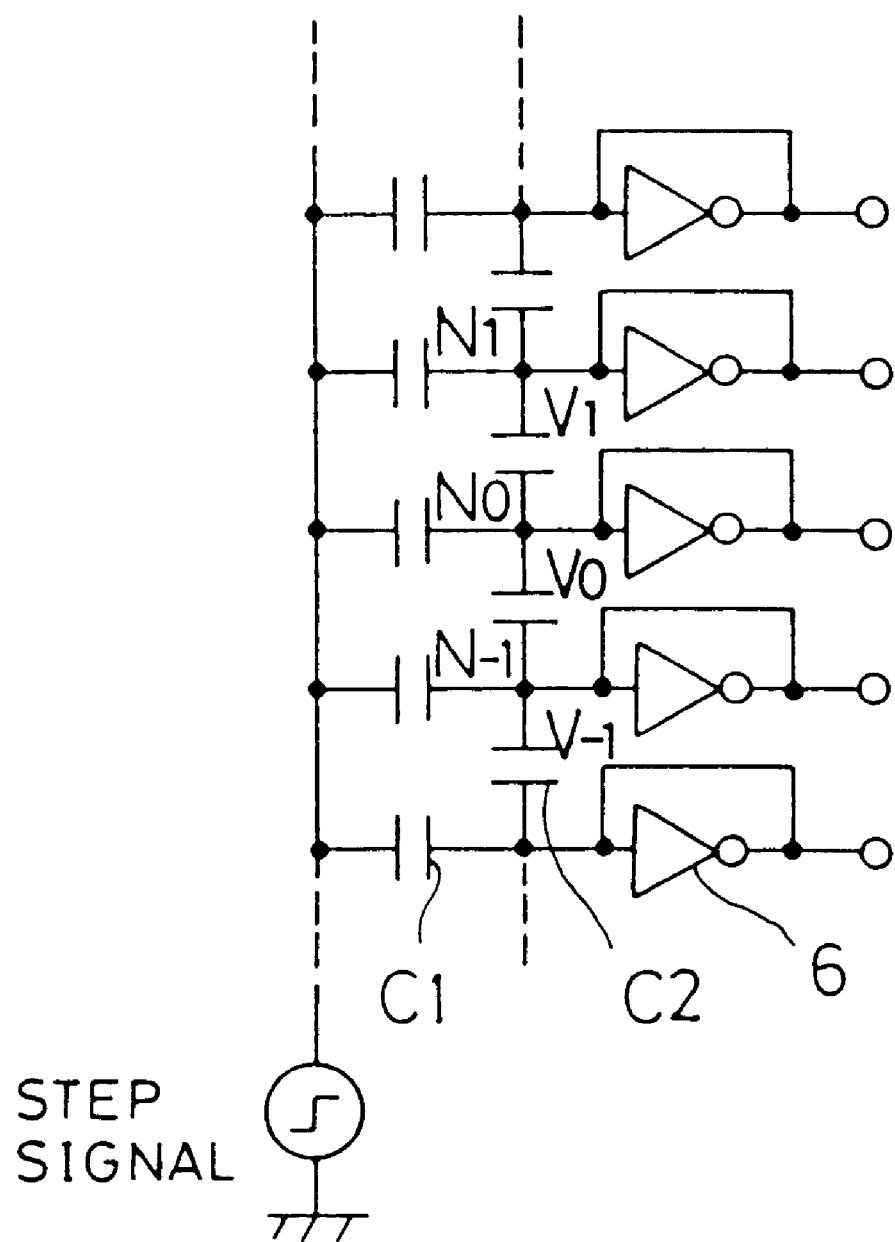
FIG. 16 shows a circuit used for seeking the step response at the time when the comparators of the ADC of FIG. 1 are at the sampling period.
Figure 17:
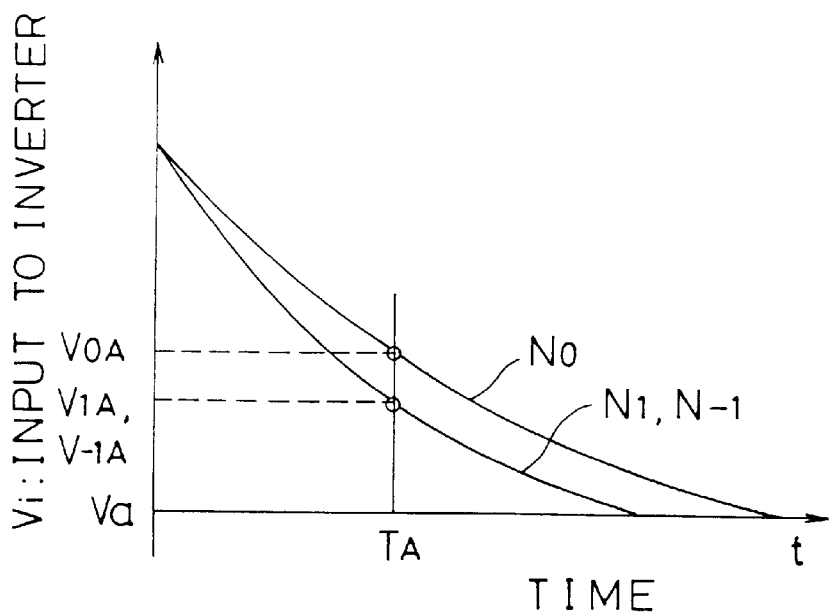
FIG. 17 shows the step response at voltages at each node when the driving performance of the inverters of FIG. 16 varies.
Figure 18:
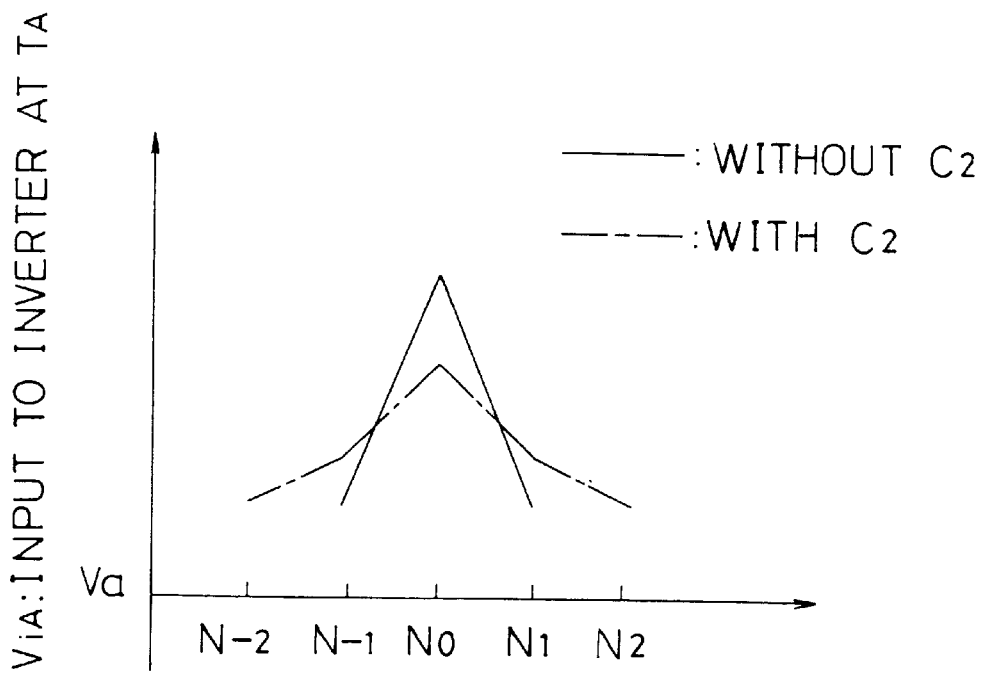
FIG. 18 shows that the voltage at the center node N0 of FIG. 16 settles soon at Va because of the action of link capacitors C2.

The fact that the frequency characteristics of the ADC are improved by means of the provision of link capacitors C2 is further explained with making reference to FIGS. 16 to 18.

When a comparator array is at the sampling period, the application of a step signal, as an analog input signal, is given (see FIG. 16). As shown in FIG. 17, if one of the inverters 6 that is connected to the central node N0 has a lesser drive performance than all other inverters, the step response at the node N0 takes a longer time to settle at Va (i.e., the input and output voltages of the inverter at the time when the input and output terminals thereof are short-circuited), compared to the nodes N1 and N−1. This means that the frequency characteristics of the entire comparator array is limited by such an inverter with a lesser drive performance. However, as shown in FIG. 18, because of the connection of link capacitors C2, the voltage at the central node N0 at time TA of FIG. 17 approaches to the voltages at the nodes N1 and N−1. In other words, time required for the node N0 to settle at Va is shorten. The frequency characteristics of the ADC is improved.

Noise from outside of the ADC, particularly one from an internal digital circuit is a cause of degrading the accuracy of conversion. This degradation can be reduced by making use of link capacitors C2. Which is described below. The power-supply voltage varies by noise, which makes the drain voltage of a MOS transistor vary. As a result, the bias voltage Va and the voltage gain G of an inverter of the comparator vary. If the variations of the bias voltage Va and the voltage gain G of the inverter are caused by noise, it is true that the amount of change in Va and the amount of change in G vary from one inverter to another. Not only because the device parameters of each inverter vary, but also because of the different layout of each inverter on a chip and the different ways each power supply line enters, the effect on each inverter by noise differs from one inverter to another. For this reason, the threshold voltage of each comparator varies in different ways. Since it is proved from the foregoing DC and AC analyses that the effects of the variation in threshold voltages and in mutual conductance are reduced, this further proves that the effects due to noise are also reduced by scattering them onto other comparators.

As described above, in accordance with the first embodiment, the link capacitors C2 work to reduce DNL of the ADC and to improve its frequency characteristics. Additionally, the like advantages are obtained even at a low power-supply voltage. Noise-resistant strength is also improved. Likewise, such advantages are obtained in the second to sixth embodiments. It is possible to omit either one of C2 and C4 in the first and second embodiments (FIGS. 2 and 4). In the fifth embodiment, at least one of C7, C8, C9, and C10 should be employed.

Figure 19:
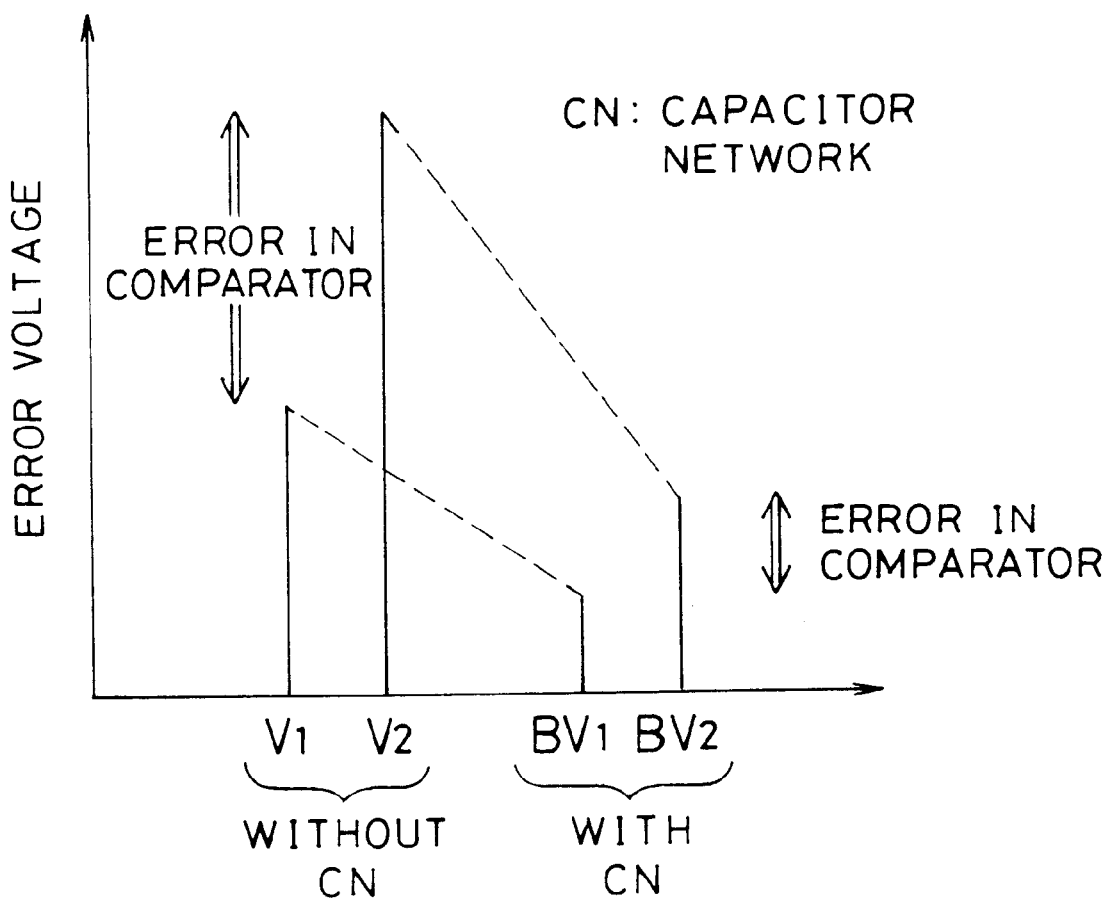
FIG. 19 shows how DNL is improved by the capacitor network in the differential chopper comparators of FIG. 5.
Figure 20:
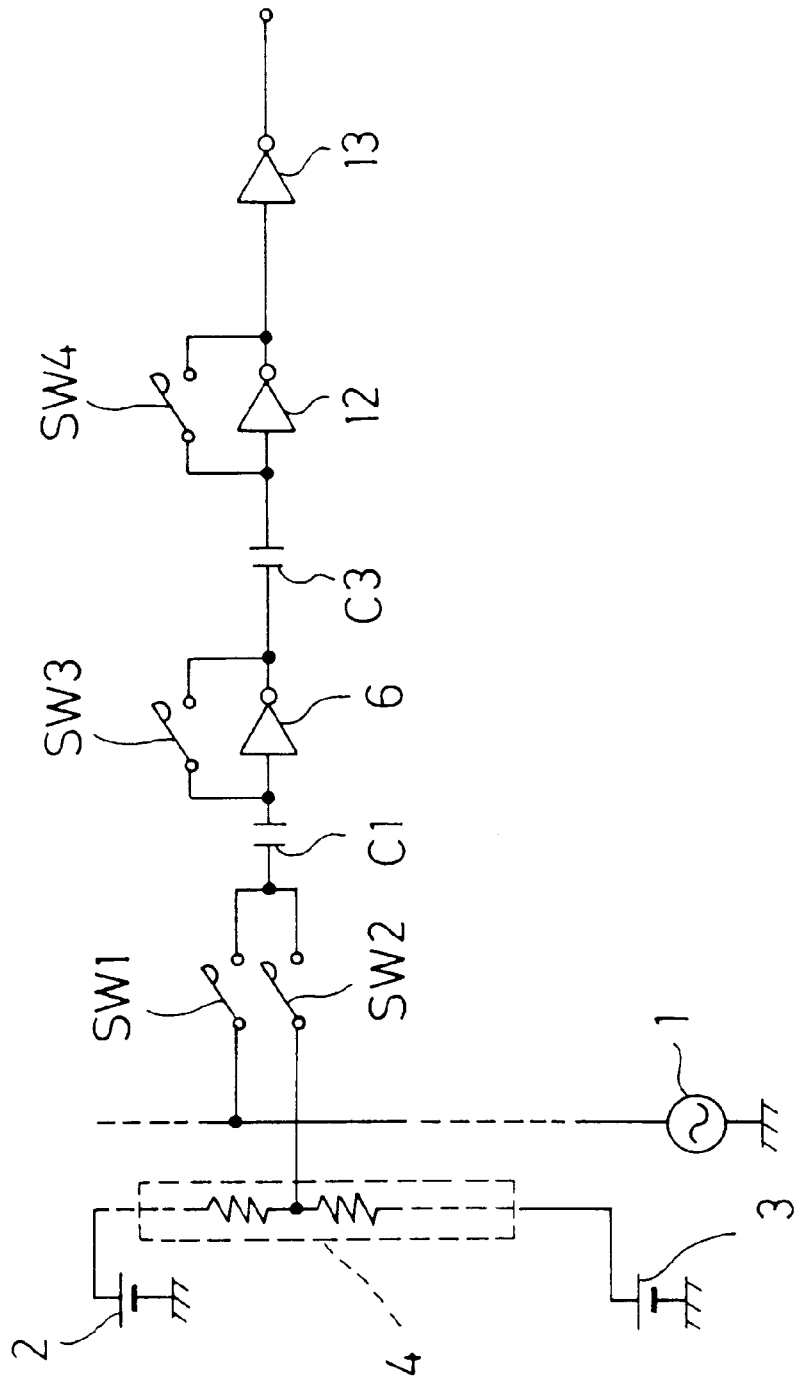
FIG. 20 shows the organization of a conventional inverter chopper comparator.
Figure 21:
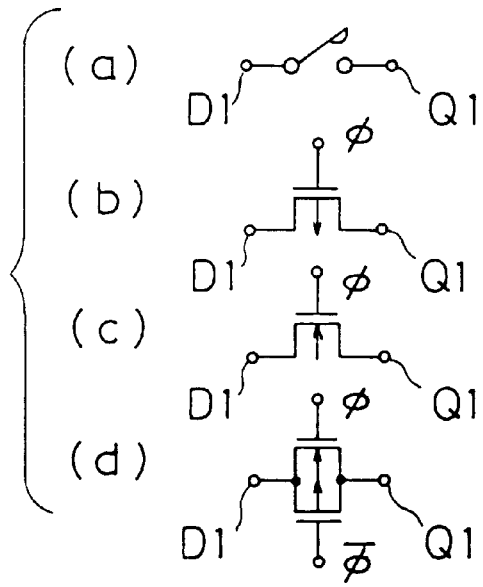
FIGS. 21($a$), ($b$), ($c$), and (d) show some configuration examples for the switches of FIG. 20, using MOS transistors.
Figure 22:
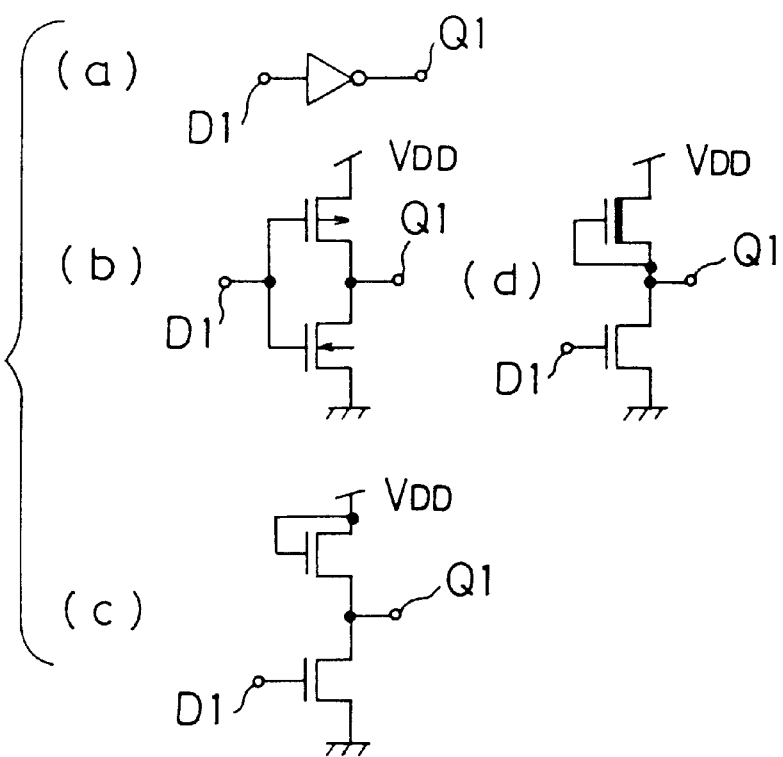
FIG. 22($a$), ($b$), ($c$), and ($d$) show some configuration examples for the inverters of FIG. 20, using MOS transistors.

In accordance with the configuration of the ADC employing the differential chopper comparators of the fifth embodiment, the error voltage of the comparator 24 is reduced according to decreases in error of both voltages held in a pair of input capacitors C5, i.e., the analog input voltage and the reference voltage. In FIG. 19, V1 and V2 show the respective error voltages incorporated in the analog input voltage and the reference voltage. Because of the action of the link capacitors, the error voltages are respectively multiplied by B(<1), which proves that the error voltage of the comparator 24 becomes B (V2−V1) and is reduced.

We claim:

1. A circuit comprising a first terminal and a second terminal in which each of the first terminal and the second terminal is ideally forced to keep an electric charge in such an amount that the first terminal and the second terminal hold respective predetermined voltages, the circuit further comprising:

setting means for setting the first terminal and the second terminal to hold the respective predetermined voltages;

a capacitor connecting the first terminal and the second terminal to each other to bring, even if a difference voltage between the first terminal and the second terminal is not held at a constant value, the difference voltage close to the constant value; and amplifying means for amplifying the respective voltages of the first terminal and the second terminal.

2. A circuit comprising plural terminals in which each of the plural terminals is ideally forced to keep an electric charge in such an amount that the plural terminals hold respective predetermined voltages, the circuit further comprising:

setting means for setting the plural terminals to hold the respective predetermined voltages;

a capacitor network connecting the plural terminals to one another to bring, even if a difference voltage among the plural terminals is not held at a constant value, the difference voltage close to the constant value; and amplifying means for amplifying the respective voltages of the first terminal and the second terminal.

3. A circuit comprising:

a first circuit having a first terminal and first switching means for forcing an electric current to flow into or from the first terminal so that the first terminal holds a first voltage during a first period of time and for forcing the first terminal to ideally keep an electric charge in such an amount that the first terminal holds a second voltage during a second period of time after the first period of time;

a second circuit having a second terminal and second switching means for forcing an electric current to flow into or from the second terminal so that the second terminal holds a third voltage during the first period of time and for forcing the second terminal to ideally keep an electric charge in such an amount that the second terminal holds a fourth voltage during the second period of time after the first period of time;

a capacitor for connecting the first terminal and the second terminal to each other so that a voltage difference between the second voltage and the fourth voltage approximates a desired constant value to bring, even if a difference voltage between the first terminal and the second terminal is not held at a constant value, the difference voltage close to the constant value;

a first MOS inverter having an input terminal connected to the first terminal; and a second MOS inverter having an input terminal connected to the second terminal.

4. A circuit according to claim 3, wherein:

the first circuit and the first MOS inverter function as a first amplifier; and the second circuit and the second MOS inverter function as a second amplifier.

5. A circuit comprising:

a first circuit having a first terminal and first switching means for forcing an electric current to flow into or from the first terminal so that the first terminal holds a first voltage during a first period of time and for forcing the first terminal to ideally keep an electric charge in such an amount that the first terminal holds a second voltage during a second period of time after the first period of time;

a second circuit having a second terminal and second switching means for forcing an electric current to flow into or from the second terminal so that, the second terminal holds a third voltage during the first period of time and for forcing the second terminal to ideally keep an electric charge in such an amount that the second terminal holds a fourth voltage during the second period of time after the first period of time;

a third circuit having a third terminal and third switching means for forcing an electric current to flow into or from the third terminal so that the third terminal holds a fifth voltage during the first period of time and for forcing the third terminal to ideally keep an electric charge in such an amount that the third terminal holds a sixth voltage during the second period of time after the first period of time;

plural capacitors for connecting the first terminal and the second terminal to each other and the second terminal and the third terminal to each other, respectively, so that a voltage difference between the second voltage and the fourth voltage and a voltage difference between the fourth voltage and the sixth voltage approximates each other, to bring, even if a difference voltage among the first terminal, the second terminal and the third terminal is not held at a constant value, the difference voltage close to the constant value;

a first MOS inverter having an input terminal connected to the first terminal;

a second MOS inverter having an input terminal connected to the second terminal; and a third MOS inverter having an input terminal connected to the third terminal.

6. A circuit according to claim 5, wherein:

the first circuit and the first MOS inverter function as a first amplifier;

the second circuit and the second MOS inverter function as a second amplifier; and the third circuit and the third MOS inverter function as a third amplifier.

7. A circuit according to claim 5, wherein:

the first circuit and the first MOS inverter function as a first amplifier for amplifying a voltage difference between a first reference voltage and an analog input voltage which are received by the first circuit;

the second circuit and the second MOS inverter function as a second amplifier for amplifying a voltage difference between a second reference voltage and the analog input voltage which are received by the second circuit; and the third circuit and the third MOS inverter function as a third amplifier for amplifying a voltage difference between a third reference voltage and the analog input voltage which are received by the third circuit.

8. A circuit comprising:

a first circuit having a first terminal and first switching means for forcing an electric current to flow into or from the first terminal so that the first terminal holds a first voltage during a first period of time and for forcing the first terminal to ideally keep an electric charge in such an amount that the first terminal holds a second voltage during a second period of time after the first period of time;

a second circuit having a second terminal and second switching means for forcing an electric current to flow into or from the second terminal so that the second terminal holds a third voltage during the first period of time and for forcing the second terminal to ideally keep an electric charge in such an amount that the second terminal holds a fourth voltage during the second period of time after the first period of time;

a capacitor for connecting the first terminal and the second terminal to each other so that a voltage difference between the second voltage and the fourth voltage approximates a desired constant value to bring, even if a difference voltage between the first terminal and the second terminal is not held at a constant value, the difference voltage close to the constant value;

a first amplifier having an input terminal connected to the first terminal; and a second amplifier having an input terminal connected to the second terminal.

9. A circuit according to claim 3, wherein:

the first circuit and the first MOS inverter function as a first amplifier for amplifying a voltage difference between a first reference voltage and an analog input voltage; and the second circuit and the second MOS inverter function as a second amplifier for amplifying a voltage difference between a second reference voltage and the analog input voltage.

* * * * *